(12) United States Patent
Glenn et al.

(10) Patent No.: US 6,875,271 B2
(45) Date of Patent: Apr. 5, 2005

(54) SIMULTANEOUS CYCLICAL DEPOSITION IN DIFFERENT PROCESSING REGIONS

(75) Inventors: W. Benjamin Glenn, Pacifica, CA (US); Donald J. Verplancken, Burlingame, CA (US)

(73) Assignee: Applied Materials, Inc., Santa Clara, CA (US)

( * ) Notice: Subject to any disclaimer, the term of this patent is extended or adjusted under 35 U.S.C. 154(b) by 34 days.

(21) Appl. No.: 10/118,863

(22) Filed: Apr. 9, 2002

(65) Prior Publication Data

US 2003/0190804 A1 Oct. 9, 2003

(51) Int. Cl.[7] ............................................. C30B 25/14
(52) U.S. Cl. ............................. 117/89; 117/94; 117/95; 117/101; 117/105
(58) Field of Search .............................. 117/89, 94, 95, 117/101, 105

(56) References Cited

U.S. PATENT DOCUMENTS

| | | | |
|---|---|---|---|
| 4,058,430 A | 11/1977 | Suntola et al. | 156/611 |
| 4,389,973 A | 6/1983 | Suntola et al. | 118/725 |
| 4,413,022 A | 11/1983 | Suntola et al. | 427/255.2 |
| 4,486,487 A | 12/1984 | Skarp | 428/216 |
| 4,767,494 A | 8/1988 | Kobayashi et al. | 156/606 |
| 4,806,321 A | 2/1989 | Nishizawa et al. | 422/245 |
| 4,813,846 A | 3/1989 | Helms | 414/744.1 |
| 4,829,022 A | 5/1989 | Kobayashi et al. | 437/107 |
| 4,834,831 A | 5/1989 | Nishizawa et al. | 156/611 |
| 4,838,983 A | 6/1989 | Schumaker et al. | 156/613 |
| 4,838,993 A | 6/1989 | Aoki et al. | 156/643 |
| 4,840,921 A | 6/1989 | Matsumoto | 437/89 |
| 4,845,049 A | 7/1989 | Sunakawa | 437/81 |
| 4,859,625 A | 8/1989 | Matsumoto | 437/81 |
| 4,859,627 A | 8/1989 | Sunakawa | 437/81 |
| 4,861,417 A | 8/1989 | Mochizuki et al. | 156/610 |

(Continued)

FOREIGN PATENT DOCUMENTS

| | | | |
|---|---|---|---|
| DE | 196 27 017 A1 | 1/1997 | H01L/21/283 |
| DE | 198 20 147 A1 | 7/1999 | H01L/21/3205 |
| EP | 0 344 352 A1 | 12/1989 | H01L/39/24 |

(Continued)

OTHER PUBLICATIONS

Hultman, et al., "Review of the thermal and mechanical stability of TiN–based thin films", *Zeitschrift Fur Metallkunde*, 90(10)(Oct. 1999), pp. 803–813.

Klaus, et al., "Atomic Layer Deposition of $SiO_2$ Using Catalyzed and Uncatalyzed Self–Limiting Surface Reactions", *Surface Review & Letters*, 6(3&4) (1999), pp. 435–448.

Yamaguchi, et al., "Atomic–layer chemical–vapor–deposition of silicon dioxide films with extremely low hydrogen content", *Appl. Surf. Sci.*, vol. 130–132 (1998), pp. 202–207.

(Continued)

*Primary Examiner*—Robert Kunemund
(74) *Attorney, Agent, or Firm*—Moser, Patterson & Sheridan, LLP

(57) ABSTRACT

A method for simultaneous deposition of multiple compounds on a substrate is provided. In one aspect, a gas stream is introduced into a processing chamber and flows across a substrate surface disposed therein. The gas stream includes at least one dose of a first compound and at least one dose of a second compound. The doses of the first and second compounds are separated by a time delay, and the at least one dose of the first compound and the at least one dose of the second compound are simultaneously in fluid communication with the substrate surface.

39 Claims, 10 Drawing Sheets

U.S. PATENT DOCUMENTS

| | | | |
|---|---|---|---|
| 4,876,218 A | 10/1989 | Pessa et al. ................. | 437/107 |
| 4,917,556 A | 4/1990 | Stark et al. ................. | 414/217 |
| 4,927,670 A | 5/1990 | Erbil ....................... | 427/255.3 |
| 4,931,132 A | 6/1990 | Aspnes et al. .............. | 156/601 |
| 4,951,601 A | 8/1990 | Maydan et al. ............. | 118/719 |
| 4,960,720 A | 10/1990 | Shimbo ..................... | 437/105 |
| 4,975,252 A | 12/1990 | Nishizawa et al. ......... | 422/245 |
| 4,993,357 A | 2/1991 | Scholz ....................... | 118/715 |
| 5,000,113 A | 3/1991 | Wang et al. ................ | 118/723 |
| 5,013,683 A | 5/1991 | Petroff et al. .............. | 437/110 |
| 5,028,565 A | 7/1991 | Chang et al. ............... | 437/192 |
| 5,082,798 A | 1/1992 | Arimoto .................... | 437/108 |
| 5,085,885 A | 2/1992 | Foley et al. ................. | 477/38 |
| 5,091,320 A | 2/1992 | Aspnes et al. ............... | 437/8 |
| 5,130,269 A | 7/1992 | Kitahara et al. ............ | 437/111 |
| 5,166,092 A | 11/1992 | Mochizuki et al. ......... | 437/105 |
| 5,173,474 A | 12/1992 | Connell et al. .............. | 505/1 |
| 5,186,718 A | 2/1993 | Tepman et al. ............. | 29/25.01 |
| 5,205,077 A | 4/1993 | Wittstock .................. | 51/165 R |
| 5,225,366 A | 7/1993 | Yoder ........................ | 437/108 |
| 5,234,561 A | 8/1993 | Randhawa et al. ........ | 204/192.38 |
| 5,246,536 A | 9/1993 | Nishizawa et al. ......... | 156/610 |
| 5,250,148 A | 10/1993 | Nishizawa et al. ......... | 156/611 |
| 5,254,207 A | 10/1993 | Nishizawa et al. ......... | 156/601 |
| 5,256,244 A | 10/1993 | Ackerman .................. | 156/613 |
| 5,259,881 A | 11/1993 | Edwards et al. ............ | 118/719 |
| 5,270,247 A | 12/1993 | Sakuma et al. ............. | 437/133 |
| 5,278,435 A | 1/1994 | Van Hove et al. .......... | 257/184 |
| 5,281,274 A | 1/1994 | Yoder ........................ | 118/697 |
| 5,286,296 A | 2/1994 | Sato et al. .................. | 118/719 |
| 5,290,748 A | 3/1994 | Knuuttila et al. ........... | 502/228 |
| 5,294,286 A | 3/1994 | Nishizawa et al. ......... | 156/610 |
| 5,296,403 A | 3/1994 | Nishizawa et al. ......... | 437/133 |
| 5,300,186 A | 4/1994 | Kitahara et al. ............ | 156/613 |
| 5,311,055 A | 5/1994 | Goodman et al. .......... | 257/593 |
| 5,316,615 A | 5/1994 | Copel et al. ................. | 117/95 |
| 5,316,793 A | 5/1994 | Wallace et al. ............. | 427/248.1 |
| 5,330,610 A | 7/1994 | Eres et al. ................... | 117/86 |
| 5,336,324 A | 8/1994 | Stall et al. .................. | 118/719 |
| 5,338,389 A | 8/1994 | Nishizawa et al. ......... | 117/89 |
| 5,348,911 A | 9/1994 | Jurgensen et al. ........... | 117/91 |
| 5,374,570 A | 12/1994 | Nasu et al. .................. | 437/40 |
| 5,395,791 A | 3/1995 | Cheng et al. ............... | 437/105 |
| 5,438,952 A | 8/1995 | Otsuka ....................... | 117/84 |
| 5,439,876 A | 8/1995 | Graf et al. .................. | 505/447 |
| 5,441,703 A | 8/1995 | Jurgensen ................... | 422/129 |
| 5,443,033 A | 8/1995 | Nishizawa et al. .......... | 117/86 |
| 5,443,647 A | 8/1995 | Aucoin et al. ........ | 118/723 ME |
| 5,455,072 A | 10/1995 | Bension et al. ........... | 427/255.7 |
| 5,458,084 A | 10/1995 | Thorne et al. .............. | 117/97 |
| 5,469,806 A | 11/1995 | Mochizuki et al. .......... | 117/97 |
| 5,480,818 A | 1/1996 | Matsumoto et al. .......... | 437/40 |
| 5,483,919 A | 1/1996 | Yokoyama et al. ........... | 117/89 |
| 5,484,664 A | 1/1996 | Kitahara et al. ............ | 428/641 |
| 5,503,875 A | 4/1996 | Imai et al. ................. | 427/255.3 |
| 5,521,126 A | 5/1996 | Okamura et al. ........... | 437/235 |
| 5,527,733 A | 6/1996 | Nishizawa et al. .......... | 437/160 |
| 5,532,511 A | 7/1996 | Nishizawa et al. .......... | 257/627 |
| 5,540,783 A | 7/1996 | Eres et al. ................... | 118/725 |
| 5,580,380 A | 12/1996 | Liu et al. ..................... | 117/86 |
| 5,601,651 A | 2/1997 | Watabe ...................... | 118/715 |
| 5,609,689 A | 3/1997 | Kato et al. ................. | 118/719 |
| 5,616,181 A | 4/1997 | Yamamoto et al. ... | 118/723 ER |
| 5,637,530 A | 6/1997 | Gaines et al. ............... | 114/105 |
| 5,641,984 A | 6/1997 | Aftergut et al. ............ | 257/433 |
| 5,644,128 A | 7/1997 | Wollnik et al. ............. | 250/251 |
| 5,667,592 A | 9/1997 | Boitnott et al. ............. | 118/719 |
| 5,674,786 A | 10/1997 | Turner et al. ............... | 437/225 |
| 5,693,139 A | 12/1997 | Nishizawa et al. .......... | 117/89 |
| 5,695,564 A | 12/1997 | Imahashi .................... | 118/719 |
| 5,705,224 A | 1/1998 | Murota et al. ........... | 427/248.1 |
| 5,707,880 A | 1/1998 | Aftergut et al. ............... | 437/3 |
| 5,711,811 A | 1/1998 | Suntola et al. .............. | 118/711 |
| 5,730,801 A | 3/1998 | Tepman et al. ............. | 118/719 |
| 5,730,802 A | 3/1998 | Ishizumi et al. ............ | 118/719 |
| 5,747,113 A | 5/1998 | Tsai ......................... | 427/255.5 |
| 5,749,974 A | 5/1998 | Habuka et al. ............. | 118/725 |
| 5,788,447 A | 8/1998 | Yonemitsu et al. ......... | 414/217 |
| 5,788,799 A | 8/1998 | Steger et al. ................ | 156/345 |
| 5,796,116 A | 8/1998 | Nakata et al. ................ | 257/66 |
| 5,801,634 A | 9/1998 | Young et al. ................ | 340/635 |
| 5,807,792 A | 9/1998 | Ilg et al. ..................... | 438/758 |
| 5,830,270 A | 11/1998 | McKee et al. .............. | 117/106 |
| 5,835,677 A | 11/1998 | Li et al. ..................... | 392/401 |
| 5,851,849 A | 12/1998 | Comizzoli et al. ............ | 438/38 |
| 5,855,675 A | 1/1999 | Doering et al. ............. | 118/719 |
| 5,855,680 A | 1/1999 | Soininen et al. ............ | 118/719 |
| 5,856,219 A | 1/1999 | Naito et al. ................. | 438/241 |
| 5,858,102 A | 1/1999 | Tsai ........................... | 118/719 |
| 5,866,213 A | 2/1999 | Foster et al. ................ | 427/573 |
| 5,866,795 A | 2/1999 | Wang et al. ................. | 73/1.36 |
| 5,879,459 A | 3/1999 | Gadgil et al. ............... | 118/715 |
| 5,882,165 A | 3/1999 | Maydan et al. ............. | 414/217 |
| 5,882,413 A | 3/1999 | Beaulieu et al. ............ | 118/719 |
| 5,904,565 A | 5/1999 | Nguyen et al. .............. | 438/687 |
| 5,916,365 A | 6/1999 | Sherman ...................... | 117/92 |
| 5,923,056 A | 7/1999 | Lee et al. .................... | 257/192 |
| 5,923,985 A | 7/1999 | Aoki et al. .................. | 438/301 |
| 5,925,574 A | 7/1999 | Aoki et al. .................... | 437/31 |
| 5,928,389 A | 7/1999 | Jevtic ........................ | 29/25.01 |
| 5,942,040 A | 8/1999 | Kim et al. ................... | 118/726 |
| 5,947,710 A | 9/1999 | Cooper et al. ................ | 418/63 |
| 5,972,430 A | 10/1999 | DiMeo, Jr. et al. ..... | 427/255.32 |
| 6,001,669 A | 12/1999 | Gaines et al. ............... | 438/102 |
| 6,015,590 A | 1/2000 | Suntola et al. ......... | 427/255.23 |
| 6,025,627 A | 2/2000 | Forbes et al. ............... | 257/321 |
| 6,036,773 A | 3/2000 | Wang et al. .................. | 117/97 |
| 6,042,652 A | 3/2000 | Hyun et al. ................. | 118/719 |
| 6,043,177 A | 3/2000 | Falconer et al. ............... | 502/4 |
| 6,051,286 A | 4/2000 | Zhao et al. ................. | 427/576 |
| 6,062,798 A | 5/2000 | Muka ........................ | 414/416 |
| 6,071,808 A | 6/2000 | Merchant et al. ........... | 438/633 |
| 6,084,302 A | 7/2000 | Sandhu ....................... | 257/751 |
| 6,086,677 A | 7/2000 | Umotoy et al. ............. | 118/715 |
| 6,110,556 A | 8/2000 | Bang et al. ................. | 428/64.1 |
| 6,113,977 A | 9/2000 | Soininen et al. .............. | 427/64 |
| 6,117,244 A | 9/2000 | Bang et al. ................. | 118/715 |
| 6,124,158 A | 9/2000 | Dautartas et al. ........... | 438/216 |
| 6,130,147 A | 10/2000 | Major et al. ................ | 438/604 |
| 6,139,700 A | 10/2000 | Kang et al. ............ | 204/192.17 |
| 6,140,237 A | 10/2000 | Chan et al. ................. | 438/687 |
| 6,140,238 A | 10/2000 | Kitch ........................ | 438/687 |
| 6,143,659 A | 11/2000 | Leem ......................... | 438/688 |
| 6,144,060 A | 11/2000 | Park et al. .................. | 257/310 |
| 6,158,077 A | * 12/2000 | Wenger et al. ............. | 15/210.1 |
| 6,158,446 A | 12/2000 | Mohindra et al. .......... | 134/25.4 |
| 6,174,377 B1 | 1/2001 | Doering et al. ............. | 118/729 |
| 6,174,809 B1 | 1/2001 | Kang et al. ................. | 438/682 |
| 6,200,893 B1 | 3/2001 | Sneh ......................... | 438/685 |
| 6,203,613 B1 | 3/2001 | Gates et al. ................. | 117/104 |
| 6,206,967 B1 | 3/2001 | Mak et al. .................. | 118/666 |
| 6,207,302 B1 | 3/2001 | Sugiura et al. ............. | 428/690 |
| 6,248,605 B1 | 6/2001 | Harkonen et al. ............. | 438/29 |
| 6,270,572 B1 | 8/2001 | Kim et al. .................... | 117/93 |
| 6,271,148 B1 | 8/2001 | Kao et al. ................... | 438/727 |
| 6,287,965 B1 | 9/2001 | Kang et al. ................. | 438/648 |
| 6,291,876 B1 | 9/2001 | Stumborg et al. ........... | 257/632 |
| 6,305,314 B1 | 10/2001 | Sneh et al. ............. | 118/723 R |
| 6,306,216 B1 | 10/2001 | Kim et al. ................... | 118/725 |
| 6,316,098 B1 | 11/2001 | Yitzchaik et al. ........... | 428/339 |
| 6,342,277 B1 | * 1/2002 | Sherman ..................... | 427/562 |

| | | | | | |
|---|---|---|---|---|---|
| 6,635,570 B1 * | 10/2003 | Galewski et al. ............ 438/681 |
| 2001/0000866 A1 | 5/2001 | Sneh et al. .............. 118/723 R |
| 2001/0009140 A1 | 7/2001 | Bondestam et al. ......... 118/725 |
| 2001/0011526 A1 | 8/2001 | Doering et al. .............. 118/729 |
| 2001/0031562 A1 | 10/2001 | Raaijmakers et al. ........ 438/770 |
| 2001/0034123 A1 | 10/2001 | Jeon et al. .................. 438/643 |
| 2001/0038922 A1 * | 11/2001 | Jonte et al. .................. 428/623 |
| 2001/0041250 A1 | 11/2001 | Werkhoven et al. ......... 428/212 |
| 2001/0042799 A1 | 11/2001 | Kim et al. ................... 239/553 |

FOREIGN PATENT DOCUMENTS

| | | | |
|---|---|---|---|
| EP | 0 429 270 A2 | 5/1991 | ............. G03F/7/36 |
| EP | 0 442 290 A1 | 8/1991 | ............ C30B/25/02 |
| EP | 0 799 641 A2 | 10/1997 | ............ B01J/20/32 |
| FR | 2626110 | 7/1989 | ............ H01L/39/24 |
| FR | 2692597 | 12/1993 | ............ C23C/16/00 |
| GB | 2 355 727 A | 5/2001 | ............ C23C/16/44 |
| JP | 58-098917 Ab | 6/1983 | ......... H01L/21/205 |
| JP | 58-100419 Ab | 6/1983 | ............ H01L/21/20 |
| JP | 60-065712 A | 4/1985 | ......... C01B/33/113 |
| JP | 61-035847 Ab | 2/1986 | ............ B01J/19/08 |
| JP | 61-210623 Ab | 9/1986 | ......... H01L/21/205 |
| JP | 62-069508 Ab | 3/1987 | ......... H01L/21/203 |
| JP | 62-091495 | 4/1987 | ............ C30B/25/02 |
| JP | 62-141717 | 6/1987 | ......... H01L/21/203 |
| JP | 62-167297 Ab | 7/1987 | ............ C30B/29/40 |
| JP | 62-171999 Ab | 7/1987 | ............ C30B/29/40 |
| JP | 62-232919 Ab | 10/1987 | ......... H01L/21/205 |
| JP | 63-062313 Ab | 3/1988 | ......... H01L/21/203 |
| JP | 63-085098 Ab | 4/1988 | ............ C30B/29/40 |
| JP | 63-090833 Ab | 4/1988 | ......... H01L/21/365 |
| JP | 63-222420 Ab | 9/1988 | ......... H01L/21/205 |
| JP | 63-222421 Ab | 9/1988 | ......... H01L/21/205 |
| JP | 63-227007 Ab | 9/1988 | ......... H01L/21/205 |
| JP | 63-252420 Ab | 10/1988 | ......... H01L/21/205 |
| JP | 63-266814 Ab | 11/1988 | ......... H01L/21/205 |
| JP | 64-009895 Ab | 1/1989 | ............ C30B/29/40 |
| JP | 64-009896 Ab | 1/1989 | ............ C30B/29/40 |
| JP | 64-009897 Ab | 1/1989 | ............ C30B/29/40 |
| JP | 64-037832 Ab | 2/1989 | ......... H01L/21/205 |
| JP | 64-082615 Ab | 3/1989 | ......... H01L/21/205 |
| JP | 64-082617 Ab | 3/1989 | ......... H01L/21/205 |
| JP | 64-082671 Ab | 3/1989 | ............ H01L/29/78 |
| JP | 64-082676 Ab | 3/1989 | ............ H01L/29/80 |
| JP | 01-103982 Ab | 4/1989 | ............ C30B/23/08 |
| JP | 01-103996 Ab | 4/1989 | ............ C30B/29/40 |
| JP | 64-090524 Ab | 4/1989 | ......... H01L/21/205 |
| JP | 01-117017 Ab | 5/1989 | ......... H01L/21/203 |
| JP | 01-143221 Ab | 6/1989 | ......... H01L/21/314 |
| JP | 01-143233 Ab | 6/1989 | ............ H01L/21/76 |
| JP | 01-154511 Ab | 6/1989 | ............ H01L/21/20 |
| JP | 01-236657 Ab | 9/1989 | ............ H01L/29/80 |
| JP | 01-245512 Ab | 9/1989 | ......... H01L/21/205 |
| JP | 01-264218 Ab | 10/1989 | ......... H01L/21/205 |
| JP | 01-270593 Ab | 10/1989 | ............ C30B/25/02 |
| JP | 01-272108 Ab | 10/1989 | ......... H01L/21/203 |
| JP | 01-290221 Ab | 11/1989 | ......... H01L/21/205 |
| JP | 01-290222 Ab | 11/1989 | ......... H01L/21/205 |
| JP | 01-296673 Ab | 11/1989 | ............ H01L/29/88 |
| JP | 01-303770 Ab | 12/1989 | ............ H01L/39/24 |
| JP | 01-305894 Ab | 12/1989 | ............ C30B/23/08 |
| JP | 01-313927 Ab | 12/1989 | ......... H01L/21/205 |
| JP | 02-012814 Ab | 1/1990 | ......... H01L/21/205 |
| JP | 02-014513 Ab | 1/1990 | ......... H01L/21/205 |
| JP | 02-017634 Ab | 1/1990 | ......... H01L/21/225 |
| JP | 02-063115 Ab | 3/1990 | ............ H01L/21/20 |
| JP | 02-074029 Ab | 3/1990 | ......... H01L/21/205 |
| JP | 02-074587 Ab | 3/1990 | ............ C30B/23/08 |
| JP | 02-106822 Ab | 4/1990 | ............ H01B/13/00 |
| JP | 02-129913 Ab | 5/1990 | ......... H01L/21/205 |
| JP | 02-162717 Ab | 6/1990 | ............ H01L/21/20 |
| JP | 02-172895 Ab | 7/1990 | ............ C30B/29/36 |
| JP | 02-196092 Ab | 8/1990 | ............ C30B/25/14 |
| JP | 02-203517 Ab | 8/1990 | ......... H01L/21/205 |
| JP | 02-230690 Ab | 9/1990 | ............ H05B/33/10 |
| JP | 02-230722 Ab | 9/1990 | ......... H01L/21/205 |
| JP | 02-246161 Ab | 10/1990 | ......... H01L/29/784 |
| JP | 02-264491 Ab | 10/1990 | ............ H01S/3/18 |
| JP | 02-283084 Ab | 11/1990 | ............ H01S/3/18 |
| JP | 02-304916 Ab | 12/1990 | ......... H01L/21/205 |
| JP | 03-019211 Ab | 1/1991 | ......... H01L/21/205 |
| JP | 03-022569 Ab | 1/1991 | ......... H01L/29/804 |
| JP | 03-023294 Ab | 1/1991 | ............ C30B/25/18 |
| JP | 03-023299 Ab | 1/1991 | ............ C30B/29/40 |
| JP | 03-044967 Ab | 2/1991 | ............ H01L/29/48 |
| JP | 03-048421 | 3/1991 | ......... H01L/21/302 |
| JP | 03-070124 Ab | 3/1991 | ......... H01L/21/205 |
| JP | 03-185716 Ab | 8/1991 | ......... H01L/21/205 |
| JP | 03-208885 Ab | 9/1991 | ............ C30B/23/02 |
| JP | 03-234025 Ab | 10/1991 | ......... H01L/21/318 |
| JP | 03-286522 Ab | 12/1991 | ......... H01L/21/205 |
| JP | 03-286531 | 12/1991 | ......... H01L/21/316 |
| JP | 04-031391 Ab | 2/1992 | ............ C30B/23/08 |
| JP | 04-031396 | 2/1992 | ............ C30B/25/14 |
| JP | 04-031396 Ab | 2/1992 | ............ C30B/25/14 |
| JP | 04-100292 Ab | 4/1992 | ............ H01S/3/18 |
| JP | 04-111418 Ab | 4/1992 | ......... H01L/21/205 |
| JP | 04-132214 Ab | 5/1992 | ......... H01L/21/205 |
| JP | 04-132681 Ab | 5/1992 | ............ C30B/25/14 |
| JP | 04-151822 Ab | 5/1992 | ......... H01L/21/205 |
| JP | 04-162418 Ab | 6/1992 | ......... H01L/21/205 |
| JP | 04-175299 Ab | 6/1992 | ............ C30B/29/68 |
| JP | 04-186824 Ab | 7/1992 | ......... H01L/21/205 |
| JP | 04-212411 Ab | 8/1992 | ......... H01L/21/203 |
| JP | 04-260696 Ab | 9/1992 | ............ C30B/29/40 |
| JP | 04-273120 Ab | 9/1992 | ............ H01L/21/20 |
| JP | 04-285167 Ab | 10/1992 | ............ C23C/14/54 |
| JP | 04-291916 Ab | 10/1992 | ......... H01L/21/205 |
| JP | 04-325500 Ab | 11/1992 | ............ C30B/33/00 |
| JP | 04-328874 Ab | 11/1992 | ......... H01L/29/804 |
| JP | 05-029228 Ab | 2/1993 | ......... H01L/21/205 |
| JP | 05-047665 Ab | 2/1993 | ......... H01L/21/205 |
| JP | 05-047666 Ab | 2/1993 | ......... H01L/21/205 |
| JP | 05-047668 Ab | 2/1993 | ......... H01L/21/205 |
| JP | 05-074717 Ab | 3/1993 | ......... H01L/21/205 |
| JP | 05-074724 Ab | 3/1993 | ......... H01L/21/205 |
| JP | 05-102189 Ab | 4/1993 | ......... H01L/21/336 |
| JP | 05-160152 Ab | 6/1993 | ......... H01L/21/336 |
| JP | 05-175143 Ab | 7/1993 | ......... H01L/21/205 |
| JP | 05-175145 Ab | 7/1993 | ......... H01L/21/205 |
| JP | 05-182906 Ab | 7/1993 | ............ H01L/21/20 |
| JP | 05-186295 Ab | 7/1993 | ............ C30B/25/02 |
| JP | 05-206036 Ab | 8/1993 | ......... H01L/21/205 |
| JP | 05-234899 Ab | 9/1993 | ......... H01L/21/205 |
| JP | 05-235047 Ab | 9/1993 | ......... H01L/21/338 |
| JP | 05-251339 Ab | 9/1993 | ............ H01L/21/20 |
| JP | 05-270997 Ab | 10/1993 | ............ C30B/29/68 |
| JP | 05-283336 Ab | 10/1993 | ............ H01L/21/20 |
| JP | 05-291152 Ab | 11/1993 | ......... H01L/21/205 |
| JP | 05-304334 Ab | 11/1993 | ............. H01L/3/18 |
| JP | 05-343327 Ab | 12/1993 | ......... H01L/21/205 |
| JP | 05-343685 Ab | 12/1993 | ......... H01L/29/784 |
| JP | 06-045606 Ab | 2/1994 | ......... H01L/29/784 |
| JP | 06-132236 Ab | 5/1994 | ......... H01L/21/205 |
| JP | 06-177381 Ab | 6/1994 | ......... H01L/29/784 |
| JP | 06-196809 Ab | 7/1994 | ............ H01S/3/18 |
| JP | 06-222388 Ab | 8/1994 | ............ G02F/1/136 |
| JP | 06-224138 Ab | 8/1994 | ......... H01L/21/205 |
| JP | 06-230421 Ab | 8/1994 | ............ G02F/1/136 |
| JP | 06-252057 Ab | 9/1994 | ......... H01L/21/205 |
| JP | 06-291048 | 10/1994 | ......... H01L/21/205 |
| JP | 07-070752 Ab | 3/1995 | ............ C23C/16/40 |

| | | | | |
|---|---|---|---|---|
| JP | 07-086269 Ab | 3/1995 | | H01L/21/314 |
| JP | 08-181076 Ab | 7/1996 | | H01L/21/205 |
| JP | 08-245291 Ab | 9/1996 | | C30B/25/14 |
| JP | 08-264530 | 10/1996 | | H01L/21/3205 |
| JP | 09-260786 Ab | 10/1997 | | H01S/3/18 |
| JP | 09-293681 Ab | 11/1997 | | H01L/21/205 |
| JP | 10-188840 Ab | 7/1998 | | H01J/29/18 |
| JP | 10-190128 Ab | 7/1998 | | H01S/3/18 |
| JP | 10-308283 Ab | 11/1998 | | H05B/33/22 |
| JP | 11-269652 Ab | 10/1999 | | C23C/16/44 |
| JP | 2000-031387 Ab | 1/2000 | | H01L/27/04 |
| JP | 2000-058777 Ab | 2/2000 | | H01L/27/108 |
| JP | 2000-068072 Ab | 3/2000 | | H05B/33/22 |
| JP | 2000-087029 Ab | 3/2000 | | C09K/11/08 |
| JP | 2000-138094 Ab | 5/2000 | | H05B/33/10 |
| JP | 2000-218445 Ab | 8/2000 | | B23P/6/00 |
| JP | 2000-319772 Ab | 11/2000 | | C23C/14/24 |
| JP | 2000-340883 Ab | 12/2000 | | H01S/5/125 |
| JP | 2000-353666 Ab | 12/2000 | | H01L/21/205 |
| JP | 2001-020075 Ab | 1/2001 | | C23C/16/44 |
| JP | 2001-062244 | 3/2001 | | B01D/53/34 |
| JP | 2001-152339 Ab | 6/2001 | | C23C/16/40 |
| JP | 2001-172767 Ab | 6/2001 | | C23C/16/40 |
| JP | 2001-189312 Ab | 7/2001 | | H01L/21/316 |
| JP | 2001-217206 Ab | 8/2001 | | H01L/21/285 |
| JP | 2001-220287 Ab | 8/2001 | | C30B/25/02 |
| JP | 2001-220294 Ab | 8/2001 | | C30B/29/20 |
| JP | 2001-240972 Ab | 9/2001 | | C23C/16/458 |
| JP | 2001-254181 Ab | 9/2001 | | C23C/16/46 |
| JP | 2001-284042 Ab | 10/2001 | | H05B/33/04 |
| JP | 2001-303251 Ab | 10/2001 | | C23C/16/44 |
| JP | 2001-328900 Ab | 11/2001 | | C30B/29/68 |
| WO | 90/02216 | 3/1990 | | C23C/14/34 |
| WO | 91/10510 | 7/1991 | | B01J/37/02 |
| WO | 93/02111 | 2/1993 | | C08F/4/78 |
| WO | 96/17107 | 6/1996 | | C23C/16/44 |
| WO | 96/18756 | 6/1996 | | C23C/16/08 |
| WO | 98/06889 | 2/1998 | | |
| WO | 98/51838 | 11/1998 | | C23C/16/06 |
| WO | 99/13504 | 3/1999 | | H01L/21/68 |
| WO | 99/29924 | 6/1999 | | C23C/16/04 |
| WO | 99/41423 | 8/1999 | | |
| WO | 00/11721 | 3/2000 | | H01L/29/43 |
| WO | 00/15865 | 3/2000 | | C23C/16/00 |
| WO | 00/15881 A2 | 3/2000 | | |
| WO | 00/16377 A2 | 3/2000 | | |
| WO | 00/54320 A1 | 9/2000 | | H01L/21/44 |
| WO | 00/63957 A1 | 10/2000 | | H01L/21/205 |
| WO | 00/79019 A1 | 12/2000 | | C23C/16/00 |
| WO | 00/79576 A1 | 12/2000 | | H01L/21/205 |
| WO | 01/15220 | 3/2001 | | H01L/21/768 |
| WO | 01/27346 A1 | 4/2001 | | C23C/16/44 |
| WO | 01/27347 A1 | 4/2001 | | C23C/16/44 |
| WO | 01/29280 A1 | 4/2001 | | C23C/16/32 |
| WO | 01/29891 A1 | 4/2001 | | H01L/21/768 |
| WO | 01/29893 A1 | 4/2001 | | H01L/21/768 |
| WO | 01/36702 A1 | 5/2001 | | C23C/16/00 |
| WO | 01/40541 A1 | 6/2001 | | C23C/16/40 |
| WO | 01/66832 A2 | 9/2001 | | C30B/25/14 |

OTHER PUBLICATIONS

George, et al., "Surface Chemistry for Atomic Layer Growth", J. Phys. Chem., vol. 100 (1996), pp. 13121–12131.

George, et al., "Atomic layer controlled deposition of $SiO_2$ and $Al_2O_3$ using ABAB . . . binary reaction sequence chemistry", Appl. Surf. Sci., vol. 82/83 (1994), pp. 460–467.

Wise, et al., "Diethyldiethoxysilane as a new precursor for $SiO_2$ growth on silicon", Mat. Res. Soc. Symp. Proc., vol. 334 (1994), pp. 37–43.

Niinisto, et al., "Synthesis of oxide thin films and overlayers by atomic layer epitaxy for advanced applications", Mat. Sci. & Eng., vol. B41 (1996), pp. 23–29.

Ritala, et al., "Perfectly conformal TiN and $Al_2O_3$ films deposited by atomic layer deposition", Chemical Vapor Deposition, vol. 5(1) (Jan. 1999), pp. 7–9.

Klaus, et al., "Atomically controlled growth of tungsten and tungsten nitride using sequential surafce reactions". Appl. Surf. Sci., vol. 162–163 (Jul. 1999), pp. 479–491.

Min, et al., "Atomic layer deposition of TiN thin films by sequential introduction of Ti precursor and $NH_3$.", Symp.: Advanced Interconnects and Contact Materials and Processes for Future Integrated Circuits (Apr. 13–16, 1998), pp. 337–342.

Min, et al., "Metal–Organic Atomic–Layer Deposition of Titanium–Silicon–Nitride Films", Applied Physics Letters, American Inst. of Physics, vol. 75(11) (Sep. 13, 1999).

Maertensson, et al., "Atomic Layer Epitaxy of Copper on Tantalum", Chemical Vapor Deposition, 3(1) (Feb. 1, 1997), pp. 45–50.

Ritala, et al. "Atomic Layer Epitaxy Growth of TiN Thin Films", J. Electrochem. Soc., 142(8) (Aug. 1995), pp. 2731–2737.

Elers, et al., "$NbCl_5$ as a precursor in atomic layer epitaxy", Appl. Surf. Sci., vol. 82/83 (1994), pp. 468–474.

Lee, "The Preparation of Titanium–Based Thin Film by CVD Using Titanium Chlorides as precursors", Chemical Vapor Deposition, 5(2) (Mar. 1999), pp. 69–73.

Martensson, et al., "Atomic Layer Epitaxy of Copper, Growth & Selectivity in the Cu (II)–2,2.6,6–Tetramethyl–3, 5–Heptanedion ATE/$H_2$ Process", J. Electrochem. Soc., 145(8) (Aug. 1998), pp. 2926–2931.

Min, et al., "Chemical Vapor Deposition of Ti–Si–N Films with Alternating Source Supply", Mat., Res. Soc. Symp. Proc., vol. 564 (Apr. 5, 1999), pp. 207–210.

Bedair, "Atomic layer epitaxy deposition processes", J. Vac. Sci. Techol. 12(1) (Jan./Feb. 1994).

Yamaga, et al., "Atomic layer epitaxy of ZnS by a new gas supplying system in a low–pressure metalorganic vapor phase epitaxy", J. of Crystal Growth 117 (1992), pp. 152–155.

Ohba, et al., "Thermal Decomposition of Methylhydrazine and Deposition Properties of CVD TiN Thin Film", Conference Proceedings, Advanced Metallization for ULSI Application in 1993 (1994), pp. 143–149.

Scheper, et al., "Low–temperature deposition of titanium nitride films from dialkylhydrazine–based precursors", Materials Science in Semiconductor Processing 2 (1999), pp. 149–157.

Suzuki, et al., "A 0.2–$\mu$m contact filing by 450°C–hydrazine–reduced TiN film with low resistivity", IEDM 92–979, pp. 11.8.1–11.8.3.

Suzuki, et al., "LPCVD–TiN Using Hydrazine and $TiCl_4$", VMIC Conference (Jun. 8–9, 1993), pp. 418–423.

IBM Tech. Disc. Bull. Knowledge–Based Dynamic Scheduler in Distributed Computer Control, (Jun. 1990), pp. 80–84.

IBM Tech. Disc. Bull. "Multiprocessor and Multitasking Architecture for Tool Control of the Advanced via Inspection Tools" (May 1992), pp. 190–191.

McGeachin, S., "Synthesis and propeties of some $\beta$–diketimines derived from acetylacetone, and their metal complexes", Canadian J. of Chemistry, vol. 46 (1968), pp. 1903–1912.

Solanki, et al., "Atomic Layer deposition of Copper Seed Layers", Electrochemical and Solid State Letters, 3(10) (2000), pp. 479–480.

NERAC.COM Retro Search: Atomic Layer Deposition of Copper, dated Oct. 11, 2001.

NERAC.COM Retro Search: Atomic Layer Deposition / Epitaxy Aluminum Oxide Plasma, dated Oct. 2, 2001.

NERAC Search abstract of "Atomic Layer deposition of Ta and Ti for Interconnect Diffusion Barriers", by Rossnagel, et al., J. Vac. Sci. & Tech., 18(4) (Jul. 2000).

Abstracts of articles re atomic layer deposition.

Abstracts of search results re atomic layer deposition, search dated Jan. 24, 2002.

Abstracts of articles re atomic layer deposition and atomic layer nucleation.

Abstracts of articles re atomic layer deposition and semiconductors and copper.

Abstracts of articles—atomic layer deposition.

NERAC Search—Atomic Layer Deposition, serach dated Oct. 16, 2001.

Bader, et al., "Integrated Processing Equipment", Solid State Technology, Cowan Pub., vol. 33, No. 5 (May 1, 1990), pp. 149–154.

Choi, et al., "The effect of annealing on resistivity of low pressure chemical vapor deposited titanium diboride", J. Appl. Phys. 69(11) (Jun. 1, 1991), pp. 7853–7861.

Choi, et al., "Stability of $TiB_2$ as a Diffusion Barrier on Silicon", J. Electrochem. Soc. 138(10) (Oct. 1991), pp. 3062–3067.

Maydan, "Cluster Tools for Fabrication of Advanced devices" Jap. J. of Applied Physics, Extended Abstracts, $22^{nd}$ Conference Solid State Devices and Materials (1990), pp. 849–852 XP000178141.

Derbyshire,"Applications of Integrated processing", Solid State Technology, US, Cowan Pub., vol. 37, No. 12 (Dec. 1, 1994), pp. 45–47.

Kitagawa, et al., "Hydrogen–mediated low temperature epitaxy of Si in plasma–enhanced chemical vapor deposition", Applied Surface Science (2000), pp. 30–34.

Lee, et al., "Pulsed nucleation for ultra–high aspect ratio tungsten plugfill", Novellus Systems, Inc. (2001), pp. 1–2 (Copy Not Available To Application At This Time).

* cited by examiner

SIMULTANEOUS CYCLICAL DEPOSITION IN DIFFERENT PROCESSING REGIONS

BACKGROUND OF THE INVENTION

1. Field of the Invention

Embodiments of the invention relate to methods of adjusting a processing stream to facilitate the sequential deposition of a film on a substrate.

2. Description of the Related Art

Atomic layer deposition (ALD) exposes a substrate to alternating reactants, and utilizes a phenomenon known as chemisorption to deposit alternating monolayers of reactive molecules on a substrate surface. For example, a first step of a conventional ALD process involves introducing a first reactive precursor into a processing chamber to chemisorb a first monolayer of molecules on a substrate surface. In a second step of a conventional ALD process, a non-reactive or purge gas is introduced into the processing chamber to remove the first reactive material from the chamber. In some cases, the purge step can last for about 2 to about 10 minutes. In a third step of a conventional ALD process, a second reactive precursor is introduced into the processing chamber to chemisorb a second monolayer of molecules adjacent the first monolayer. The adjacent monolayers react to form a desired film on the substrate surface. In a fifth step of a conventional ALD process, a purge gas is again introduced into the processing chamber to remove reactive material and reaction by-products from the chamber. In some cases, this purge step can also last for about 2 to about 10 minutes. The process steps described above are repeated until a desired film thickness is formed.

The desire to economically fabricate advanced semiconductor devices pushes processing sequences to ever increasing levels of performance and productivity. Slower rates of deposition due to multiple processing steps, such as those of a conventional ALD process are not helpful toward achieving competitive performance and productivity. Further, batch processes, which simultaneously process multiple wafers, are used to achieve a desired throughput of wafers per hour. As a result, any problem encountered during processing can result in the ruination of an entire batch of wafers. Additionally, the architecture of chambers for batch processing is complex and can cause variation in results from wafer to wafer within a batch.

There is a need, therefore, for a sequential deposition process having increased deposition rates. More particularly, there is a need for a deposition process that eliminates the need for substantially purging a processing chamber between the introduction of deposition gases.

SUMMARY OF THE INVENTION

A method for simultaneous deposition of multiple compounds on a substrate is provided. In one aspect, a gas stream is introduced into a processing chamber and flows across a substrate surface disposed therein. The gas stream includes at least one dose of a first compound and at least one dose of a second compound. The doses of the first and second compounds are separated by a time delay, and the at least one dose of the first compound and the at least one dose of the second compound are simultaneously in fluid communication with the substrate surface.

In one aspect, the gas stream also includes a continuous flow of a non-reactive gas. In another aspect, the gas stream also includes at least one pulse of a non-reactive gas between each pulse of the first and second compounds. The non-reactive gas separates the reactive compounds from one another, thereby allowing the reactive compounds to be simultaneously in fluid communication with the substrate surface without cross contamination or unwanted deposition. In yet another aspect, the gas stream provides some overlapping/intermingling of the first and second compounds at an interface therebetween.

BRIEF DESCRIPTION OF THE DRAWINGS

So that the manner in which the above recited embodiments of the present invention are attained and can be understood in detail, a more particular description of the invention, briefly summarized above, may be had by reference to the embodiments thereof which are illustrated in the appended drawings.

It is to be noted, however, that the appended drawings illustrate only typical embodiments of this invention and are therefore not to be considered limiting of its scope, for the invention may admit to other equally effective embodiments.

DETAILED DESCRIPTION OF THE PREFERRED EMBODIMENT

Figure 1:
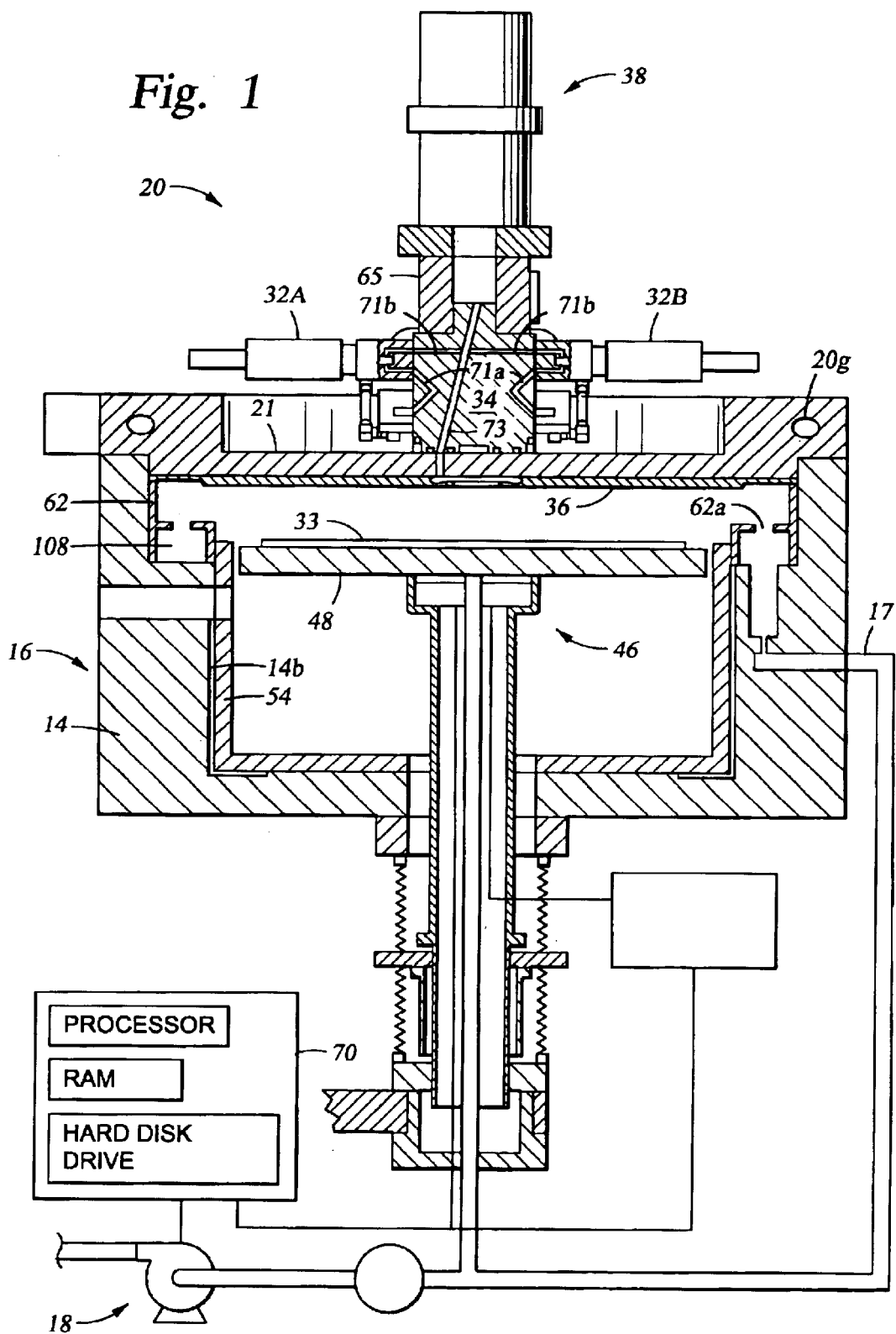
FIG. 1 is cross section of an exemplary processing system capable of performing the methods described herein.

A method for simultaneous deposition of multiple compounds to form consistent films on a surface of a workpiece/substrate is provided. In one aspect, two or more compounds, two or more groupings of compounds, or two or more combinations thereof are sequentially introduced into a reaction zone of a processing chamber. This sequential introduction forms a wave/chain of continuous pulses of gas within the processing chamber. Each compound or grouping of compounds is separated by a time delay/pause to allow each compound to adhere and/or react on the substrate surface. For example, a first compound or grouping of compounds (A) is dosed/pulsed into the reaction zone followed by a first time delay/pause. Next, a second compound or grouping of compounds (B) is dosed/pulsed into the reaction zone followed by a second time delay. In another aspect, a third compound or grouping of compounds (C), a fourth compound or grouping of compounds (D), a fifth compound or grouping of compounds (E) and so on, may be dosed/pulsed into the reaction zone, if desired; each separated by a third time delay, a fourth time delay, a fifth time delay, and so on. These sequential tandems of a pulse of compound followed by a time delay are repeated indefinitely until a desired film or film thickness is formed on the substrate surface.

In another aspect, two or more compounds, two or more groupings of compounds, or two or more combinations thereof are nearly simultaneously introduced into a reaction zone of a processing chamber to form a wave/chain of continuous pulses of gas within the processing chamber. Each subsequent pulse of the same compound or grouping of compounds is separated by a time delay/pause. To illustrate this aspect with reference to a two compound system, a dosing valve providing a pulse of compound A or grouping of compounds (A) may be closing as a dosing valve providing a pulse of compound B or grouping of compounds (B) is opening, for example. Similarly, in a multiple compound system, a dosing valve providing a pulse of compound A or grouping of compounds (A) may be closing as one or more dosing valves providing a pulse of compounds B, C, D, etc. or grouping or compounds (B, C, D, etc.) respectively, is opening.

Accordingly, multiple waves containing A and B for a two precursor or A, B, C, D, etc. for a multiple precursor system, can be simultaneously located in a reaction zone of a processing chamber and in contact with a substrate surface. As a result, a dose of compound B, which trails a dose of A within the chain of gases, adsorbs onto the previously adsorbed molecular layer of A to form a film of AB. Similarly, a dose of A adsorbs onto a previously deposited film/layer AB. This chain of gases is continued until a desired film or film thickness is formed.

A "pulse/dose" as used herein in intended to refer to a quantity of a particular compound that is intermittently or non-continuously introduced into a reaction zone of the processing chamber. The quantity of a particular compound within each pulse may vary over time, depending on the duration of the pulse. A particular compound may include a single compound or a mixture/combination of two or more compounds. However, a continuous flow of a particular compound is also contemplated by the present invention as described herein and thus, is not outside the scope thereof.

The term "compound" is intended to include one or more precursors, reductants, reactants, and catalysts, or a combination thereof. The term "compound" is also intended to include a grouping of compounds, such as when two or more compounds are introduced in a processing system at the same time. For example, a grouping of compounds may include one or more catalysts and one or more precursors. A wide variety of semiconductor processing precursor, compounds and reactants may be used. Examples may include titanium tetrachloride ($TiCl_4$), tungsten hexafluoride ($WF_6$), tantalum pentachloride ($TaCl_5$), titanium iodide ($TiI_4$), titanium bromide ($TiBr_4$), tetrakis(dimethylamido) titanium (TDMAT), pentakis(dimethyl amido) tantalum (PDMAT), tetrakis(diethylamido) titanium (TDEAT), tungsten hexacarbonyl ($W(CO)_6$), tungsten hexachloride ($WCl_6$), tetrakis (diethylamido) titanium (TDEAT), pentakis (ethyl methyl amido) tantalum (PEMAT), pentakis(diethylamido)tantalum (PDEAT), ammonia ($NH_3$), hydrazine ($N_2H_4$), monomethyl hydrazine ($CH_3N_2H_3$), dimethyl hydrazine ($C_2H_6N_2H_2$), t-butylhydrazine ($C_4H_9N_2H_3$), phenylhydrazine ($C_6H_5N_2H_3$), 2,2'-azoisobutane (($CH_3$)$_6C_2N_2$), ethylazide ($C_2H_5N_3$), and nitrogen ($N_2$), for example.

The term "reaction zone" is intended to include any volume within a processing chamber that is in fluid communication with a substrate surface being processed. The reaction zone, therefore, includes a volume adjacent an outlet of each dosing valve, as well as a volume above the substrate surface. More particularly, the reaction zone includes a volume downstream of each dosing valve and above the substrate surface.

Dose times for each pulse/dose of compound range in durations. Durations for each pulse/dose are variable and may be adjusted to accommodate, for example, the stoichiometry of a desired film, the geometry of the device being formed, the volume capacity of the processing chamber as well as the capabilities of a vacuum system coupled thereto. Additionally, the dose time of a compound may vary according to the flow rate of the compound, the pressure of the compound, the temperature of the compound, the type of dosing valve, the type of dosing control system employed, as well as the ability of the compound to adsorb onto the substrate surface. In general, dose times should be long enough for a layer of a compound to adsorb/chemisorb onto the entire surface of the substrate.

For example, durations of each pulse/dose of compound may be the same or may vary during a deposition cycle or any portion of a cycle. In other words, a duration of a first pulse of compound A may be equal to or different than a duration of a first pulse of compound B, and a duration of a second pulse of compound A may be equal to or different than the duration of the first pulse of compound B and a duration of a second pulse of compound B, and so forth for each cycle of the deposition process. Likewise, durations of subsequent pulses of compounds A and B may be equal to or different than their respective previous pulses.

Further, the delay/pause between pulses of compound may be the same or may vary during a deposition cycle or portion of a cycle. Likewise, durations of a pulse of compound A and durations of a delay after pulses of compound A may be the same or may vary from durations of a pulse of compound B and durations of a delay after pulses of compound B for each deposition cycle or any portion of a cycle. The delays are advantageously adjusted to allow adsorption or reaction of a previously pulsed compound. A delay may also be adjusted to allow one or more treatment processes to proceed, such as annealing, densification, and nitrification for example.

In yet another aspect, a separate flow of gas is introduced to the reaction zone of the processing chamber during the deposition process. The separate flow of gas may be introduced as a continuous flow or as one or more separately initiated flows, such as one or more pulses for example, between each pulse of deposition compound. A continuous separate flow of gas in conjunction with one or more pulses of the separate flow of gas may also be used.

It is perceived to have as many different separate flows of gas, whether continuous or pulsed, as there are deposition compounds. In other words, each deposition compound may utilize its own separate flow of gas continuous and/or pulse. Alternatively, a single separate flow of gas, continuous and/or pulsed, may be all that is needed.

Each separate flow of gas, whether continuous or pulsed, may contain a single gas or a mixture/combination of two or more gases. The separate flow of gas may contain gases that are non-reactive with the compounds introduced for the purpose of deposition on the wafer. The separate flow of gas may also contain gases that are reactive with one another or reactive with one or more of the compounds introduced for the purpose of deposition to form intermediate compounds, reactive compounds, and/or non-depositing compounds, for example. Exemplary gases include inert gases such as argon, helium, and nitrogen. Exemplary gases also include purge gases such as, for example, hydrogen, nitrogen, argon and helium.

It is believed that the separate flow of gas, whether continuous and/or pulsed, enhances the removal of excess compounds from the reaction zone to limit or eliminate the likelihood of side reactions, unwanted deposition, and cross-contamination, much like a purge gas, for example. When continuous, the separate flow of gas may also function as a delivery/carrier gas for one or more of the compounds.

It is also believed, however, that many processes and device fabrication schemes will not require complete separation of the compounds. These processes and device fabrication schemes may easily tolerate some co-reaction of the precursors while the majority of the film is formed using isolated pulses of compounds. Co-reaction may occur because of some overlap between preceding or subsequent pulses of compounds. For example, a pulse of compound A is introduced followed by a short time day, if any at all, then a pulse of compound B is introduced, followed by a short time day, if any at all, then a pulse of compound A, and so on until a desired film thickness is achieved. The delay between pulses is so slight that there is some overlap of the pulses that a co-reaction of A/B or B/A may occur. One advantage to having overlapping pulses is that very little or no time delay is required. Accordingly, the compounds can be pulsed more rapidly which leads to faster deposition rates. Of course, a continuous separate flow of gas (P) may be used to help with the efficient movement of the gas stream or wave through the processing system. However, when co-reaction is to be avoided, the separate flow of gas (P) is used between pulses of compounds or the period of non-dosing between sequential compounds may be lengthened, based upon reactor design, the particular diffusion characteristics of the compounds used, and the use of vacuum pumps.

Embodiments of the method described above may be used to advantage within any processing chamber capable of supplying two or more compounds. One representative a processing chamber is described below with reference to FIG. 1.

FIG. 1 shows a cross section of a representative process chamber having a chamber body 14 and a lid assembly 20 disposed thereon. The chamber body 14 includes a pumping plate 62 through which the chamber is exhausted, a liner 54, a support pedestal 48, and a slit valve 44 disposed therein. The slit valve 44 is formed within a side wall 14b of the chamber body 14 and allows transfer of a substrate 33 to and from the interior of the chamber body 14 without compromising the fluid-tight seal formed between the lid assembly 20 and the chamber body 14. Any conventional substrate transfer assembly (not shown) may be used, such as a robotic wafer transfer assembly, for example. One example of a conventional robotic wafer transfer assembly is described in the commonly assigned U.S. Patent titled "Multi-chamber Integrated Process System", (U.S. Pat. No. 4,951,601), which is incorporated by reference herein.

The support pedestal 48 is disposed within the chamber body 14 and includes a lifting mechanism (not shown) to position a substrate (not shown), such as a semiconductor wafer for example, therein. One example of a lifting mechanism for the support pedestal 48 is described in the commonly assigned U.S. Patent, entitled "Self-Aligning Lift Mechanism", (U.S. Pat. No. 5,951,776), which is incorporated by reference herein. The support pedestal 48 may be heated to transfer heat to the substrate (not shown) depending on the requisite process conditions. The support pedestal 48 may be heated by applying an electric current from an AC power supply (not shown) to a heating element (not shown) embedded within the support pedestal 48. Alternatively, the support pedestal 48 may be heated by radiant heat emitted from a secondary source (not shown) as is known in the art. Further, the support pedestal 48 may be configured to hold the substrate (not shown) using vacuum pressure. In this arrangement, the support pedestal 48 includes a plurality of vacuum holes (not shown) placed in fluid communication with a vacuum source (not shown). Likewise, the support pedestal 48 need not include a lift, but may be stationary.

The liner 54 is disposed about the support pedestal 48 and circumscribes the interior, vertical surfaces of the chamber body 14. The liner 54 is constructed of any process compatible material named above, such as aluminum, and is preferably made of the same material as the chamber body 14. A purge channel 108 is formed within the liner 54 and is in fluid communication with a pumping port 17 that extends through a side wall of the chamber body 14. A pump system 18 is connectable to the chamber body 14 adjacent the pumping port 17, and helps direct the flow of fluids within the chamber body 14.

The pumping plate 62 defines an upper surface of the purge channel 108 and controls the flow of fluid between the chamber body 14 and the pumping port 17. The pumping plate 62 is an annular member having a plurality of apertures 62a formed there-through. The diameter, number, and position of apertures 62a formed in the pumping plate 62 restrict the flow of gases exiting the chamber body 14 thereby containing the gases in contact with a substrate (not shown) disposed within the chamber body 14. The apertures 62a provide consistent and uniform exhaust of the chamber.

The lid assembly 20 includes a lid plate 21 and a gas manifold 34 disposed on an upper surface of the lid plate 21. The gas manifold 34 includes a plurality of gas channels 71a, 71b, and 73, to deliver one or more compounds, carrier gases, purge gases, cleaning gases and/or other fluids.

The valves 32A, 32B are high speed actuating valves having two or more ports. For example, the valves 32A, 32B may be electronically controlled (EC) valves, which are commercially available from Fujikin of Japan as part number FR-21-6.35 UGF-APD. The valves 32A, 32B precisely and repeatedly deliver short pulses of process gases into the processing chamber. The valves 32A, 32B can be directly controlled by a system computer, such as a mainframe for example, or controlled by a chamber/application specific controller, such as a programmable logic computer (PLC) which is described in more detail in the co-pending U.S. Patent application entitled "Valve Control System For ALD Chamber", Ser. No. 09/800,881, filed on Mar. 7, 2001, which is incorporated by reference herein. The valves 32A, 32B have valve open and close cycles of less than about one second, and in one embodiment, of less than about 0.1 second, such as microsecond and millisecond ranges. In one aspect, the valves 32A, 32B are three-way valves tied to both a compound and a separate flow of purge/carrier gas source. As will be explained in more detail below, each valve 32A, 32B meters a compound while a separate flow of purge/carrier gas continuously flows through the valve 32A, 32B. Other valves that operate at substantially the same speed and precision may also be used.

A reaction zone is formed within both the lid assembly 20 and the chamber body 14. The reaction zone refers to any volume in fluid communication with the substrate surface to be processed. More specifically, the reaction zone formed within the lid assembly 20 includes a volume within gas channels 71b and 73, and a volume adjacent the outlets of each valve 32A, 32B, including any volume adjacent a discharge side of a diaphragm of each valve 32A, 32B. The reaction zone formed within the chamber body 14 includes the volume above the substrate 33. More specifically, the reaction zone within the chamber body 14 is defined by a lower surface of the lid plate 21 and an upper surface of the substrate 33 when the lid assembly 20 is in a closed position.

The lid assembly 20 may also include one or more gas reservoirs (not shown) that are connected between one or more process gas sources and the gas manifold 34. The gas reservoirs may provide bulk gas delivery proximate to each of the valves 32A, 32B. The reservoirs are sized to insure that an adequate gas volume is available proximate to the valves 32A, 32B during each cycle of the valves 32A, 32B during processing to minimize time required for fluid delivery thereby shortening sequential deposition cycles. For example, the reservoirs may be about 5 times the volume required in each gas deposition cycle.

The processing system may further include a structure to shift between a cyclical deposition mode and a cleaning mode. The cleaning mode assists the removal of unwanted by-product formation from the interior of the processing chamber. For example, a valve 65 is disposed between a cleaning source 38 and the lid assembly 20. Both the cleaning source 38 and the valve 65 may be disposed on an upper surface of the gas manifold 34. The cleaning source 38 is a compact system for providing cleaning reagents, typically in the form of fluorine or fluorine radicals, to remove contaminants and deposition byproducts from the chamber 16. In one embodiment, the cleaning source 38 is a remote plasma source that typically includes subsystems (not shown) such as a microwave generator in electrical communication with a plasma applicator, an auto-tuner and an isolator. In another embodiment, the cleaning source 38 provides the separate flow of gas that both cleans the chamber and removes any non-adsorbed reactive species from the chamber.

The processing system may further include a microprocessor controller 70 which may be one of any form of general purpose computer processor (CPU) that can be used in an industrial setting for controlling various chambers and sub-processors. The computer may use any suitable memory, such as random access memory, read only memory, floppy disk drive, hard disk, or any other form of digital storage, local or remote. Various support circuits may be coupled to the CPU for supporting the processor in a conventional manner. Software routines, as required, may be stored on the memory or executed by a second CPU that is remotely located.

The software routines are executed to initiate process recipes or sequences. The software routines, when executed, transform the general purpose computer into a specific process computer that controls the chamber operation so that a chamber process is performed. For example, software routines may be used to precisely control the activation of the electronic control valves for the execution of process sequences according to the present invention. Alternatively, the software routines may be performed in hardware, as an application specific integrated circuit or other type of hardware implementation, or a combination of software or hardware.

To further illustrate the invention, embodiments of a sequential deposition method using at least two compounds or groupings of compounds (A, B) to form a consistent film on a substrate surface disposed within a processing system 200 capable of cyclical deposition, such as for example, the processing system described in FIG. 1 will now be described. FIGS. 2–7 are merely illustrative of the sequential flow paths described herein, and are not intended to represent actual flow dynamics thereof. Instead, FIGS. 2–7 provide a sequential, still frame, schematic illustration of a representative cyclical, simultaneous deposition process. More particularly, FIGS. 2–7 illustrate a flow path of each compound or grouping of compounds and each separate flow of gas as each material flows through a mass flow controller (MFC) 210, 212 through a control valve 220, 222, and across the substrate surface 230 disposed within the processing chamber 200. Further, FIGS. 2–7 show in greater detail how each pulse/dose of material enters into a central area of the processing chamber which is substantially in-line with a central zone/portion of a substrate disposed therein, and then flows/propagates radially outward to an outer peripheral zone/edge of the substrate. Furthermore, it is to be noted that the distance/gap between the substrate surface and the lid of the processing system 200 has been exaggerated for illustrative purposes.

A substrate is described below as having a central zone, a mid-radius zone, a peripheral zone, and an outer peripheral zone. Each zone contains one or more waves of compound depending on the volume and velocity of each wave. The term "zones" as used herein, is intended to provide a point of reference along the substrate surface relative to a center point thereof. It is not intended to limit the scope herein to a particular number of zones or to a particular location on the substrate surface. Furthermore, it is not intended to limit the scope herein to a particular geometry. The substrate may be round as well as polygonal, squared, rectangular, curved, or otherwise non-circular, such as a substrate used in the fabrication of flat panel display, for example.

Figure 2:
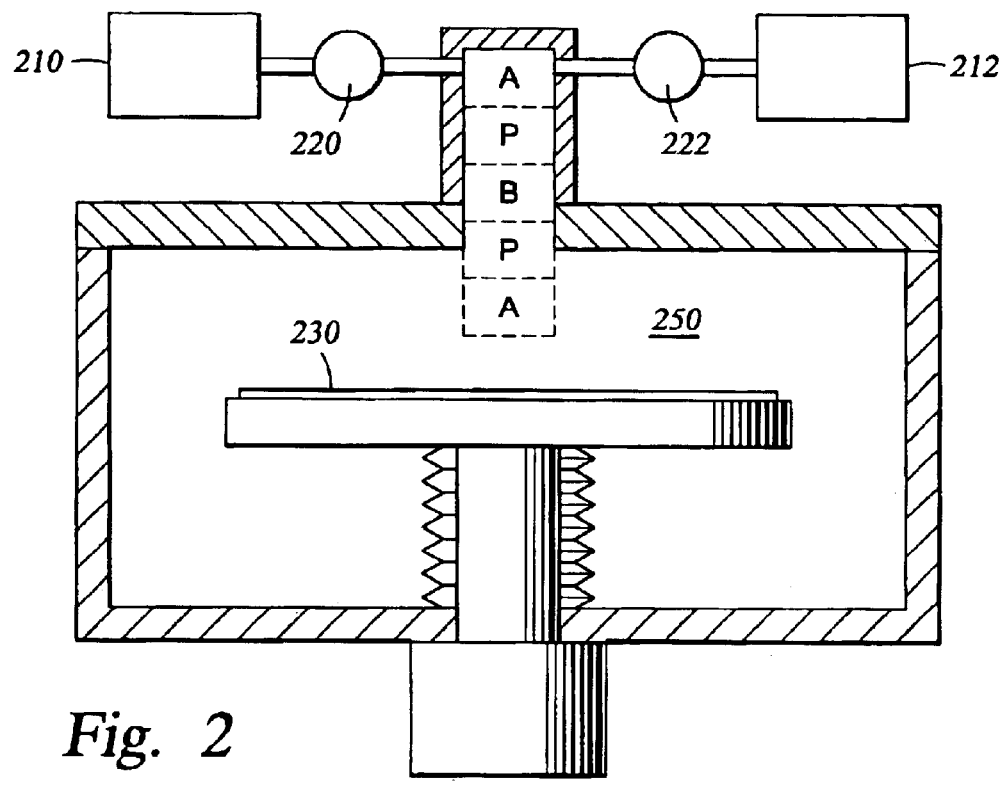
FIG. 2 shows a simplified diagram at time $T_1$ when two compounds are initially introduced into a processing system.

FIG. 2 shows an initiation or time $T_1$. A first valve 220 releases a dose/pulse of A into a reaction zone 250 of the processing chamber 200 followed by a dose/pulse of P. Then, a second valve 222 releases a dose/pulse of B into the reaction zone followed by a dose/pulse of P. These steps are repeated to form a wave/chain of continuous doses of gas into the reaction zone and across the surface of the substrate disposed therein. Prior to $T_1$, the temperature and pressure in the chamber may be stabilized.

In one aspect, each pulse of compound A, B, etc. is separated/isolated by a time delay, and the separate flow of gas (P) flows continuously during the deposition process such that only P flows between pulses of each compound or grouping of compounds. In another aspect, each pulse of compound A, B, etc. is separated/isolated by a time delay, and the separate flow of gas (P) is pulsed during the time delays to form a continuous gas stream within the processing system. In yet another aspect, each pulse of compound A, B, etc. is rapidly introduced so that no time delay or a slight time delay separates the pulses. In this event, some overlapping/intermingling of the pulses may occur at the interfaces therebetween.

Figure 3:
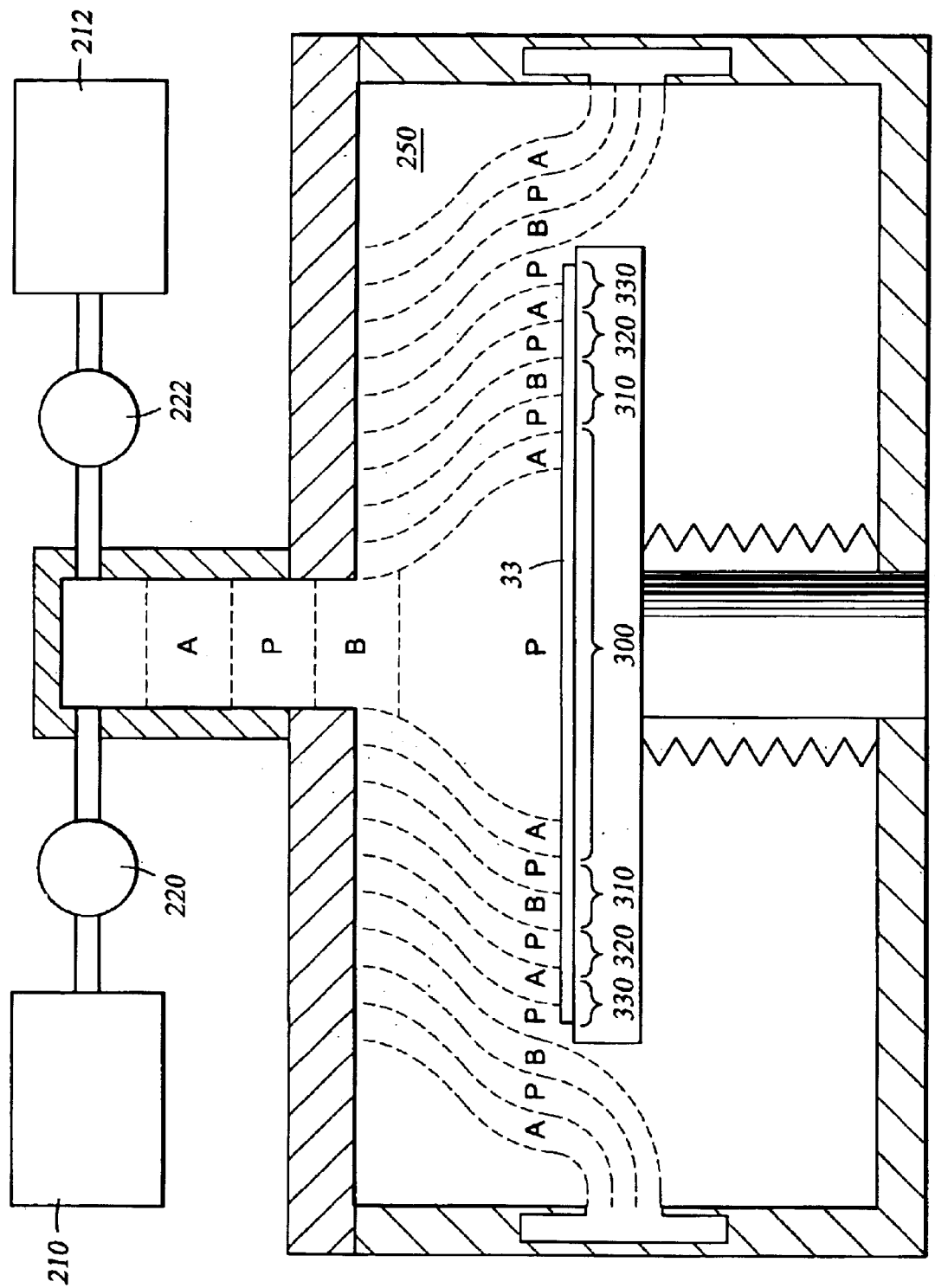
FIG. 3 illustrates a schematic cross section of a processing system during deposition.

FIG. 3 illustrates a schematic cross section of a processing system during deposition. As shown, each compound or grouping of compounds first contacts a central zone/portion 300 of the substrate and radially moves/propagates outward across the substrate surface 33. Radially adjacent the central zone 300 is the mid-radius zone 310. Radially adjacent the mid-radius zone is the peripheral zone 320. The outer peripheral zone 330 is radially adjacent the peripheral zone 320 and represents the outer diameter or edge of the substrate surface 33. Therefore, starting at the center of the substrate surface 33, a wave of gas first contacts the central zone 300, then the mid-radius zone 310, then the peripheral zone 320, and then the outer peripheral zone 330 before the wave exits the processing chamber via the vacuum/exhaust system 340.

Figure 4:
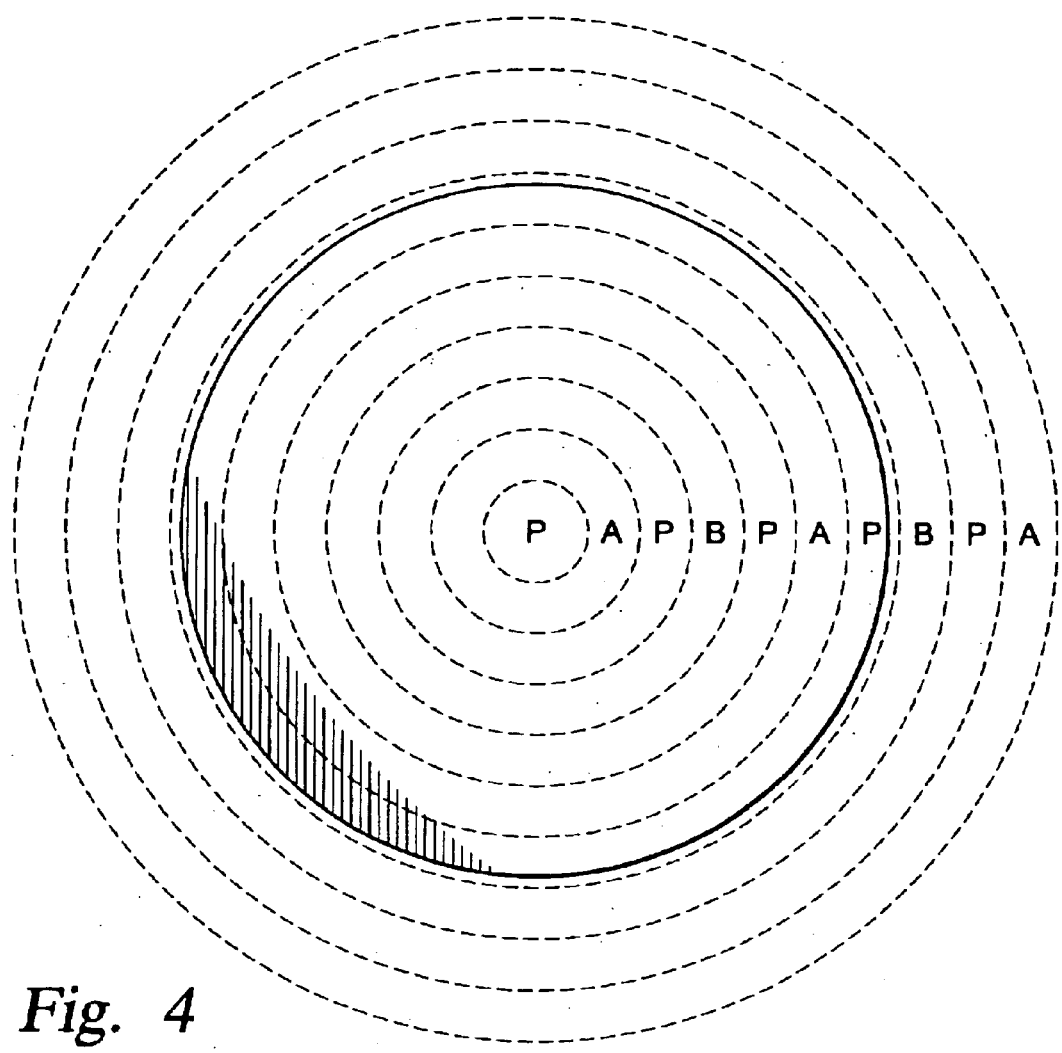
FIG. 4 illustrates a schematic plan view of the substrate disposed within the processing system of FIG. 3.

FIG. 4 illustrates a schematic plan view of the substrate disposed within the processing system of FIG. 3. As shown, more than one wave of compounds or groupings of compounds may contact a particular zone of the substrate surface. It is clearly shown that both A and B are in contact with the substrate surface at the same time but not in contact with an identical area on the substrate surface and not directly in contact with one another.

In the event P is a continuous flow, P may continuously flow through three-way dosing valves 220, 222 as the valves respectively dose A and B. Alternatively, P may continuously flow through only one of the valves 220, 222. Still alternatively, P may continuously flow through a third dosing valve (not shown). In the event P is pulsed into the chamber, a third dosing valve (not shown) is used. As mentioned above, each separate flow of gas (P) may contain the same one or more gases or each separate flow of gas may contain different gases depending on the type of films to be deposited.

Figure 5:
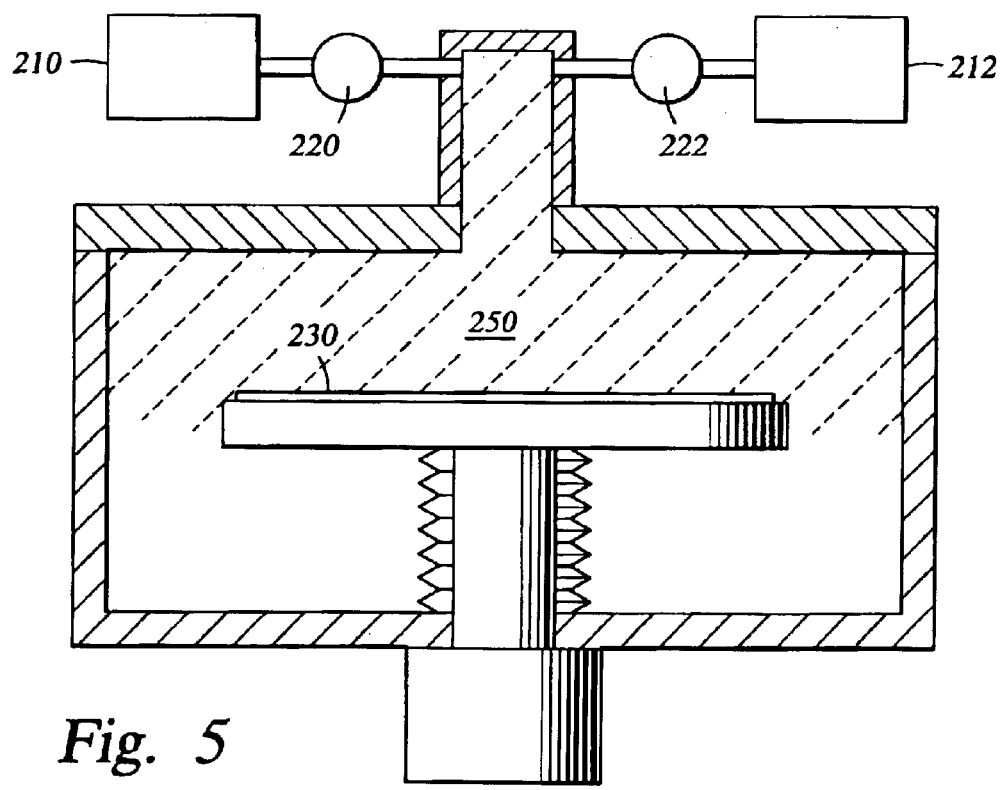
FIG. 5 illustrates a reaction zone within the processing system shown in FIGS. 1 and 2.

For further clarification, FIG. 5 highlights the reaction zone 250 within the exemplary processing system. As discussed above, the reaction zone is any volume that is in fluid communication with the substrate surface being processed. More particularly, the reaction zone is a volume formed between an outlet of each dosing valve 220 and an upper surface of the substrate 230 being processed within the processing chamber 200.

Figure 6:
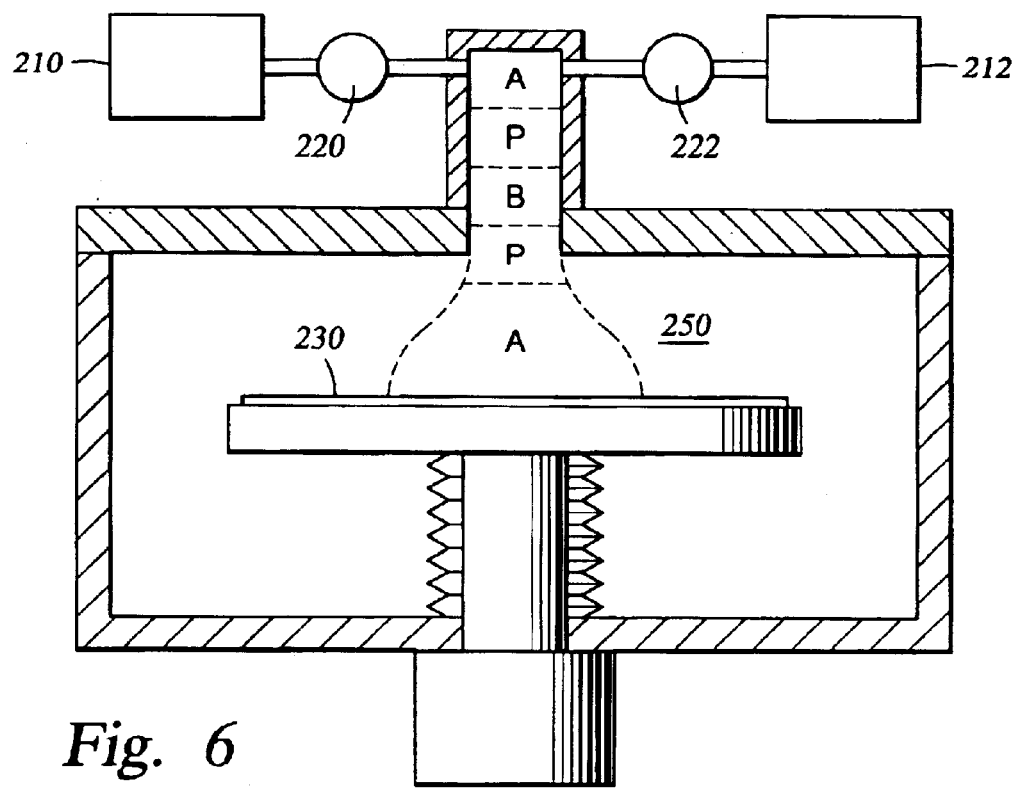
FIG. 6 shows a simplified diagram at time $T_2$ when compound A is in fluid contact with a central portion of a substrate.

FIG. 6 shows a simplified diagram of the system at time $T_2$ when compound A reaches a central zone of the substrate surface 230. As shown, A contacts at least at a portion of the central zone allowing the molecules of A to adsorb thereon. At this point, no reaction takes place anywhere on the substrate surface, but B is simultaneously contained within the reaction zone and is separated from A by P. The pressure exerted on A by the gas stream in combination with the lower pressure of the chamber causes the dose of A to radially propagate toward an edge of the substrate.

Figure 7:
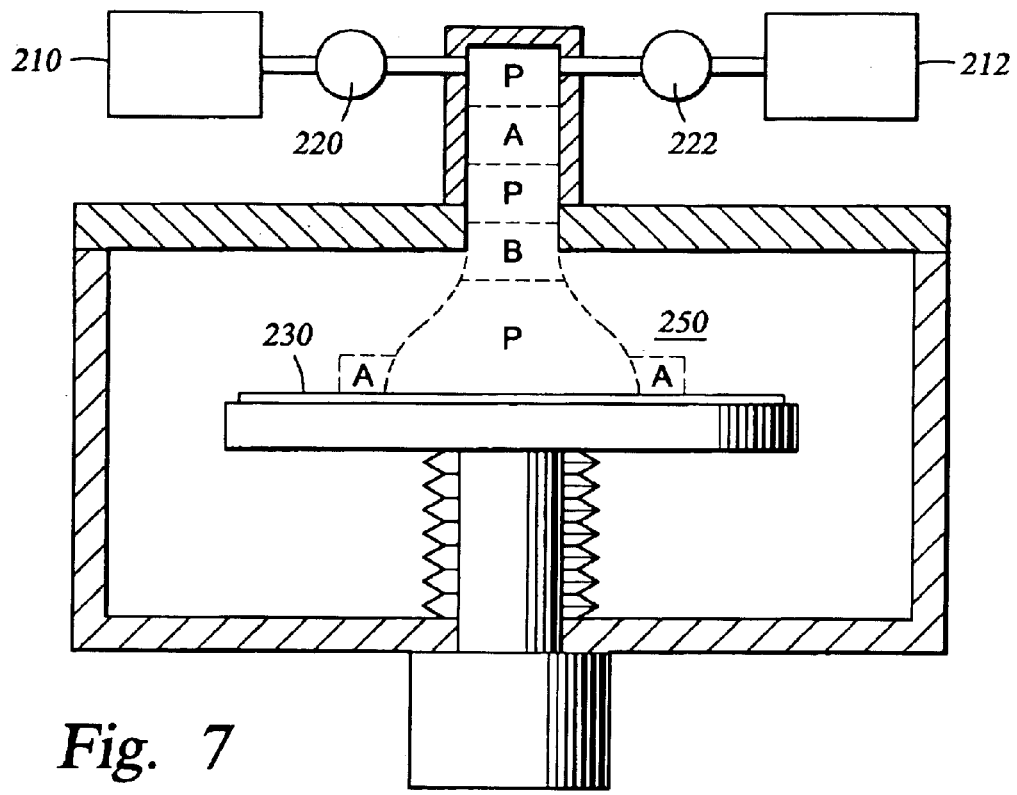
FIG. 7 shows a simplified diagram of the system at time $T_3$ when compound A reaches a mid-radius portion of a substrate.

FIG. 7 shows a simplified diagram of the system at time $T_3$ when compound A reaches the mid-radius zone of the substrate surface. At $T_3$, the molecules of A adsorb onto at least a portion of the mid-radius zone and continue to adsorb onto the central zone. P is now in contact with at least a portion of the central zone and carries away any non-adsorbed A therefrom. Again, no reaction takes place, but B is simultaneously contained within the reaction zone and is separated from A by P. In the peripheral zone and outer peripheral zones, no adsorption or reaction occurs. The differential pressure continues to move A toward an edge of the substrate.

Figure 8:
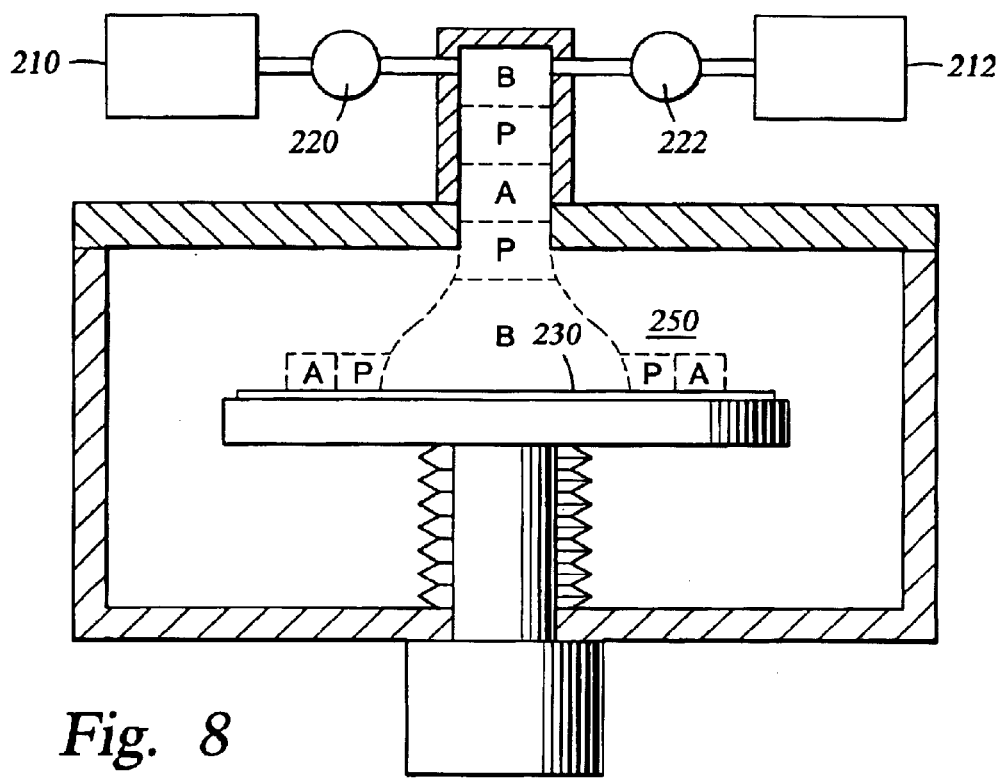
FIG. 8 shows a simplified diagram of the system at time $T_4$ when compound A reaches an outer peripheral portion of the substrate and compound B contacts a central portion of the substrate.

FIG. 8 shows a simplified diagram of the system at time $T_4$ when A reaches the peripheral zone of the substrate surface. Here, the molecules of A adsorb onto at least a portion of the peripheral zone of the substrate while B contacts with at least a portion of the central zone that A had previously adsorbed onto. Accordingly, B adsorbs onto the layer of A and reacts to form a film of AB. In the mid-radius zone, A may still adsorb onto the substrate surface as P separates B from A and carries away any non-adsorbed A, but no reaction takes place. In the outer peripheral zone, no adsorption or reaction occurs. The differential pressure continues to move A toward an edge of the substrate.

Figure 9:
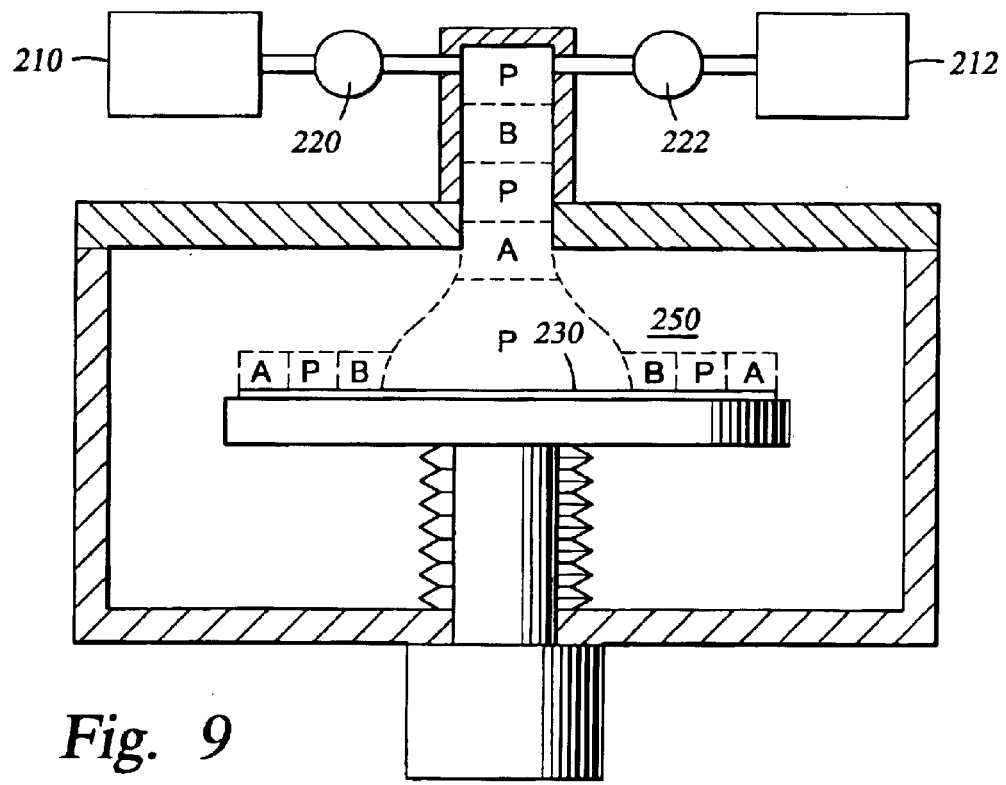
FIG. 9 shows a simplified diagram of the system at time $T_5$ when compound A reaches an outer edge of the substrate and compound B moves toward the mid-radius section of the substrate.

FIG. 9 shows a simplified diagram of the system at time $T_5$ when A reaches the outer peripheral zone of the substrate surface and B moves toward the mid-radius zone of the substrate. At this point, the molecules of A adsorb onto at least a portion of the outer peripheral zone of the substrate surface while B contacts at least a portion of the mid-radius zone that A had previously adsorbed onto. Accordingly, B adsorbs onto the layer of A and reacts to form a film of AB. In the peripheral zone, A may still be adsorbing onto the substrate surface as P separates the pulse of B from A and carries away any non-adsorbed A, but no reaction takes place. The central zone is covered by P so no adsorption or reaction takes place. The differential pressure continues to move the waves toward an edge of the substrate and into the vacuum system.

Figure 10:
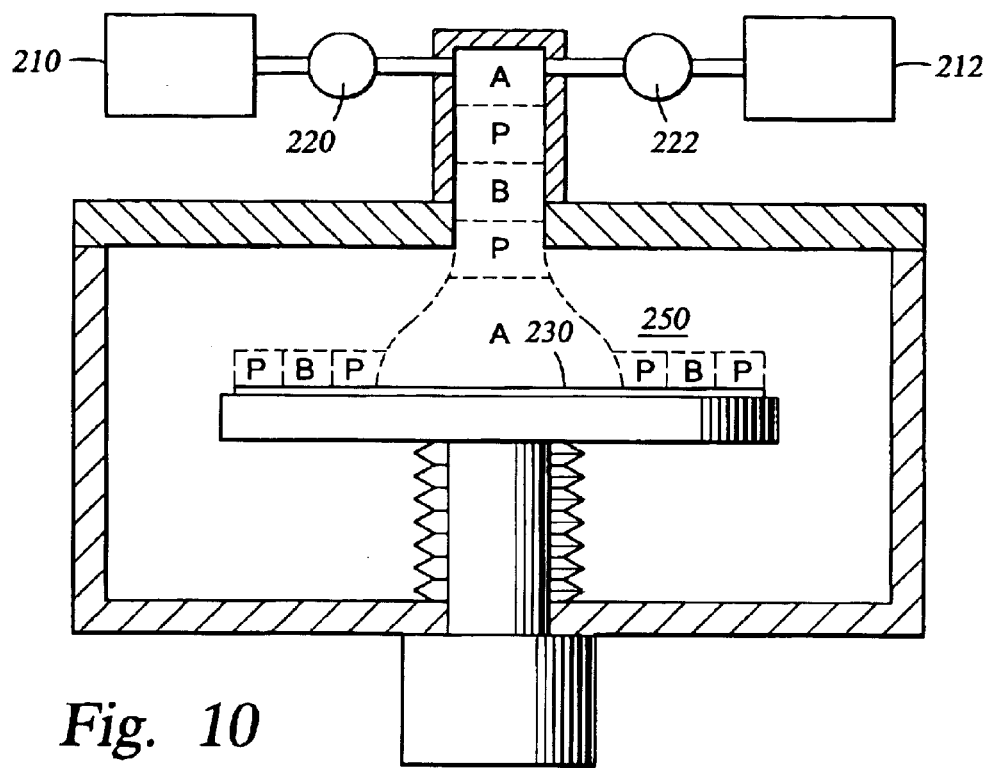
FIG. 10 shows a simplified diagram of the system at time $T_6$ when compound B reaches an outer edge of the substrate and compound A contacts a central portion of the substrate.

FIG. 10 shows a simplified diagram of the system at time $T_6$ when B reaches the peripheral zone of the substrate surface and a subsequent pulse of A contacts at least a portion of the central zone. Also, the first pulse of A has fully traversed the substrate surface and exited the chamber via the vacuum system. In the peripheral zone, the molecules of B adsorb onto at least a portion of the peripheral zone that A had previously adsorbed onto. Accordingly, B adsorbs onto the layer of A and reacts to form a film of AB. In the central zone, the subsequent pulse of A adsorbs onto at least a portion of the AB layer formed by the previous cycle. The mid-radius and the outer peripheral zones are covered by P, so no adsorption or reaction takes place. In the mid-radius zone, P separates the subsequent pulse of A from B and carries away any non-adsorbed B, but no reaction takes place. In the outer peripheral zone, P separates B from any part of A that may not have exited the chamber. The differential pressure continues to move the waves toward an edge of the substrate and into the vacuum system.

The simultaneous presence of the compounds A and B within the reaction zone provides many advantages. One of which, is an increased product throughput since the processing time is greatly reduced. The processing time is reduced because the adsorption of A is simultaneously occurring with the adsorption of B at any given portion/zone of the substrate surface. Likewise, the reaction of A and B is simultaneously occurring with the adsorption of A and B at any given zone of the substrate surface. All the while, A and B are separated from one another to prevent cross-contamination and unwanted deposition.

The continuous gas stream described above with reference to FIGS. 2–7 may also be useful with equipment having a cassette-like chamber construction. A "cassette-like chamber" is intended to refer to a multiple wafer, stacked reaction design. In these arrangements, substrates are typically positioned horizontally on planar elements and stacked vertically, one on top of another within an enclosure. Process gases are flowed across the substrate surfaces in a flow path that is substantially parallel to the substrate surfaces. A laminar flow regime across the substrate surfaces is typically used.

Figure 11:
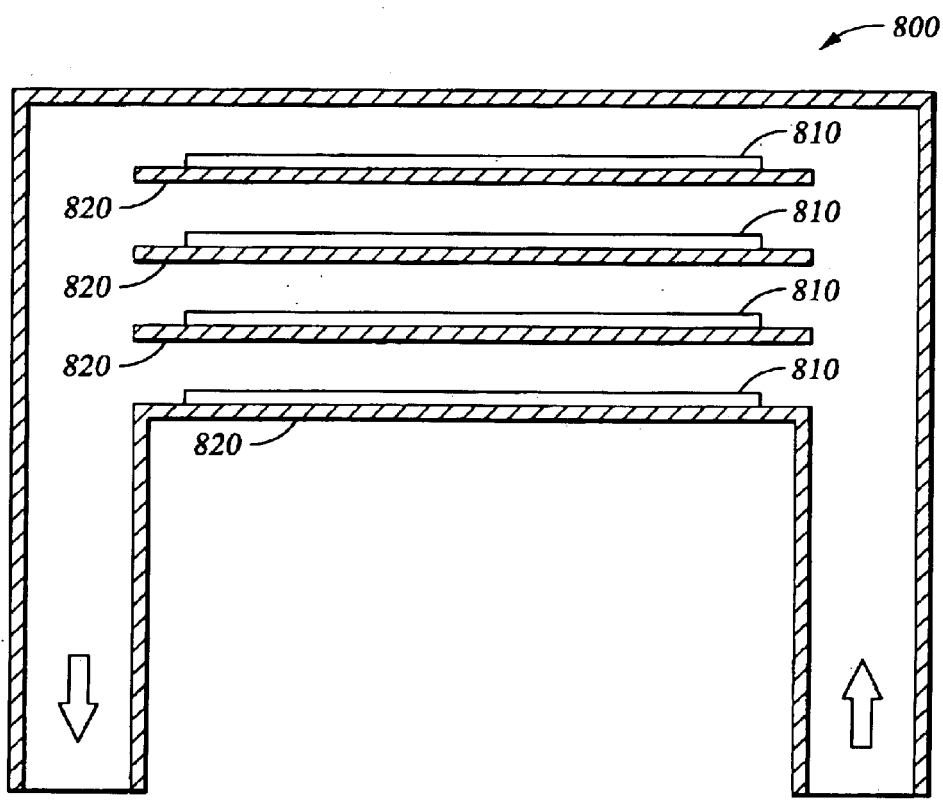
FIG. 11 shows a simplified diagram of a cassette-like reaction chamber.

FIG. 11 shows a simplified diagram of a cassette-like reaction chamber 800 having a plurality of substrates 810 disposed therein. In this arrangement, each substrate 810 is placed horizontally on a planar element 820 that is stacked vertically on top of another planar element supporting a substrate 810 thereon to form the cassette-like reaction chamber 800. Similar to the continuous gas stream described above, continuous doses of A and B separated by one or more separate flows of gas (P) flow across the substrates like individual waves in a direction substantially parallel to the surface of the substrates 810. As explained above, each separate flow of gas (P) may be continuous or pulsed. Alternatively, some overlap of A and B takes place because the doses of A and B are not separated by P, or the delay between A and B is so slight.

As shown, the doses of A and B move like waves across the substrate surface, whereby the waves originate at a first section of the substrate surface and traverse/propagate across the substrate surface toward a second section, a third section, and so forth, to a distal, outer edge of the substrate and into an exhaust/vacuum system. As a result, the dose of compound B, which trails the dose of A within the chain of gases, adsorbs onto the previously adsorbed molecular layer of A to form a film of AB. Similarly, a subsequent dose of A adsorbs onto a previously deposited film/layer AB. This chain of gases is continued until a desired film or film thickness is formed.

For clarity and ease of description, a two compound system is described below. Also for clarity, a substrate will be described below as having a proximate section, a central section, and a distal end section. However, it should be understood that any number of sections may be formed depending on the velocity of the gas stream moving across the substrate surface. Furthermore, embodiments of the invention will be described in more detail below with reference to a single substrate. It is to be appreciated that these embodiments may be used on each substrate within the multiple substrate processing system.

Figure 12:
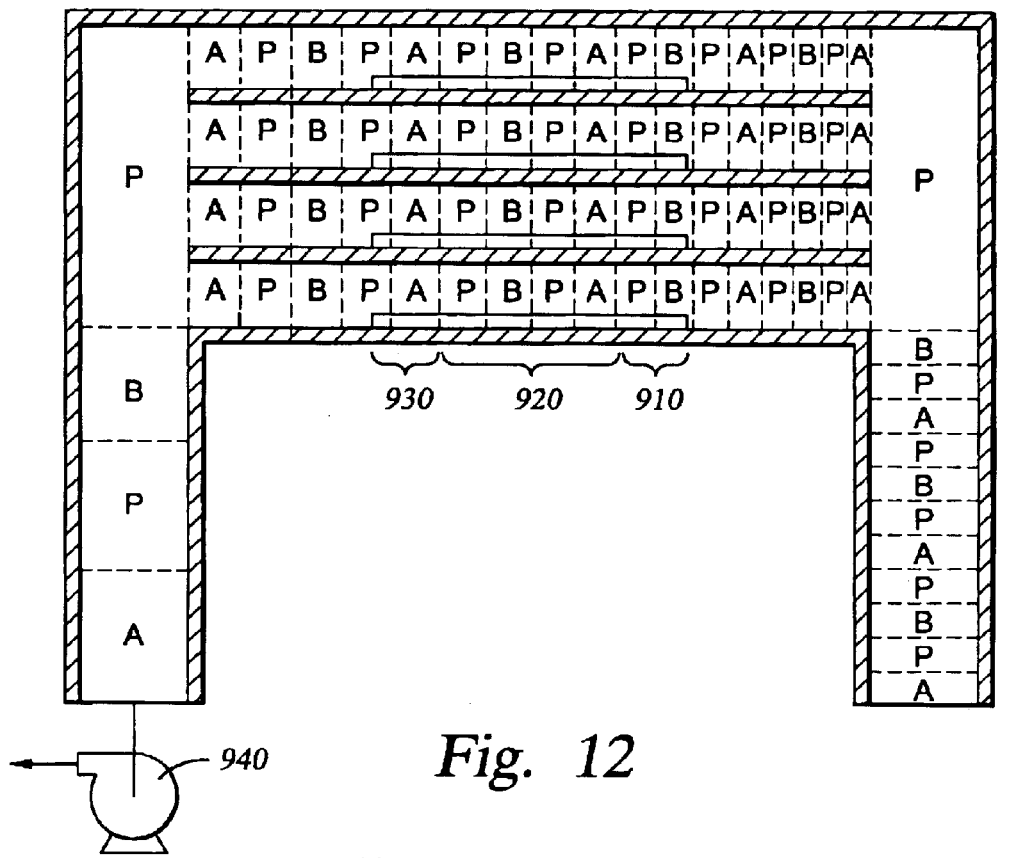
FIG. 12 is a schematic illustration showing a proximate section, a central section, and a distal end section of each substrate surface disposed within the processing chamber shown in FIG. 11.

FIG. 12 is a schematic illustration showing a proximate section 910, a central section 920, and a distal end section 930 of each substrate surface disposed within the processing chamber shown in FIG. 11. As shown, the proximate section 910 identifies a section of the substrate closest to the inlet gas stream. The distal end section 930 identifies a portion of the substrate furthest from the inlet gas stream and closest to the exhaust/vacuum system. The central section identifies a portion of the substrate disposed between the proximate section 910 and the distal end section 930. Therefore, a wave of gas first contacts the proximate section 910 of the substrate surface, then the mid-radius section 920, and then the distal end section 930 before the wave exits the processing chamber via the vacuum/exhaust system 940.

Figure 13:
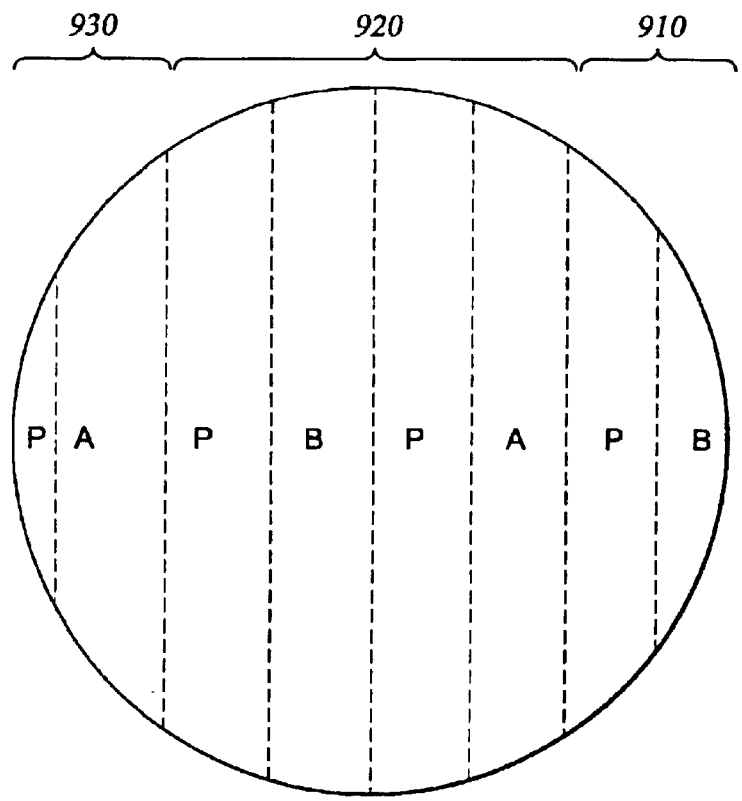
FIG. 13 is a schematic of a single wafer showing the proximate section, central section, and distal end section of the substrate surface.

FIG. 13 is a schematic of a single wafer showing the proximate section 910, central section 920, and distal end section 930 of the substrate surface. FIG. 13 also more clearly shows the waves of compounds that traverse/propagate the substrate surface. As shown, more than one wave of compounds or groupings of compounds may contact a particular zone of the substrate surface. It is clearly shown that both A and B are in contact with the substrate surface at the same time but not in contact with an identical area on the substrate surface and not directly in contact with one another.

Figure 14:
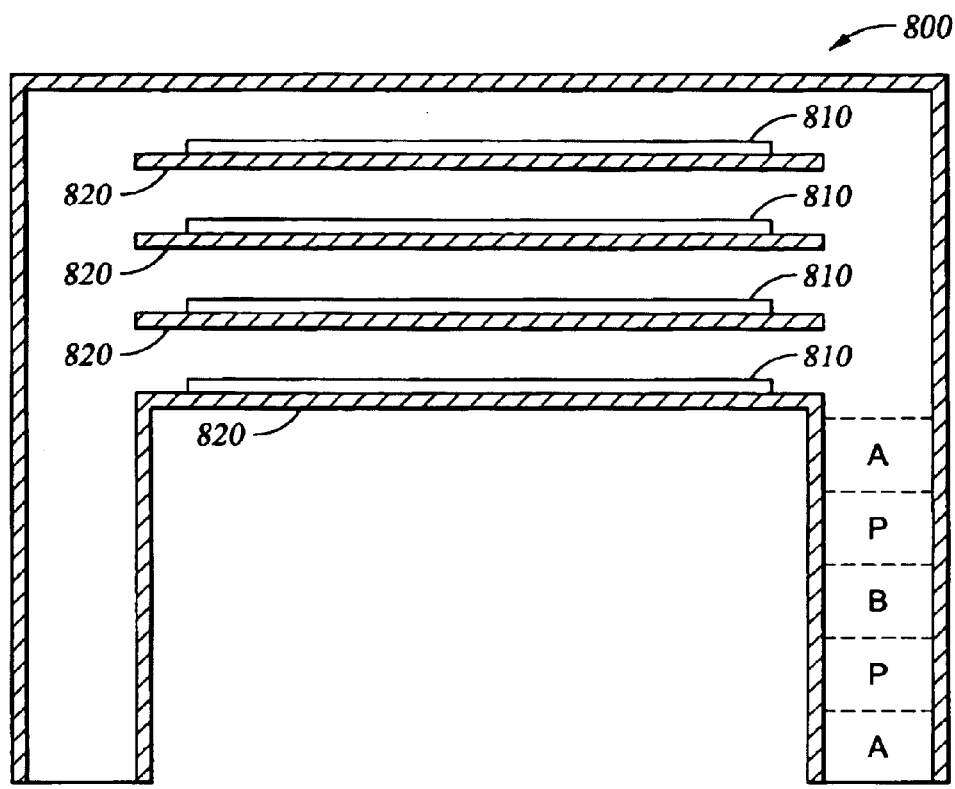
FIG. 14 shows a simplified diagram of one substrate disposed within a reaction chamber at time $T_1$ when the compounds A, B, and purge gas P are initially introduced into the processing system.

FIG. 14 shows a simplified diagram of one substrate disposed within the cassette-like reaction chamber pack system 800 at time $T_1$ when A, B and P are initially introduced into a reaction zone of the processing system. Again, the reaction zone is any volume/space that is in fluid communication with the substrate surfaces being processed. As shown, both A and B are simultaneously contained in the reaction zone. The duration of each pulse of A, B, and P, if P is non-continuous or the delay between each pulse of A and B if P is a continuous flow, is scaled so that a dose of compound may evenly reach the distal end edge of each substrate disposed within the processing system. As mentioned above, each separate flow of gas (P) may be continuous of pulsed.

Figure 15:
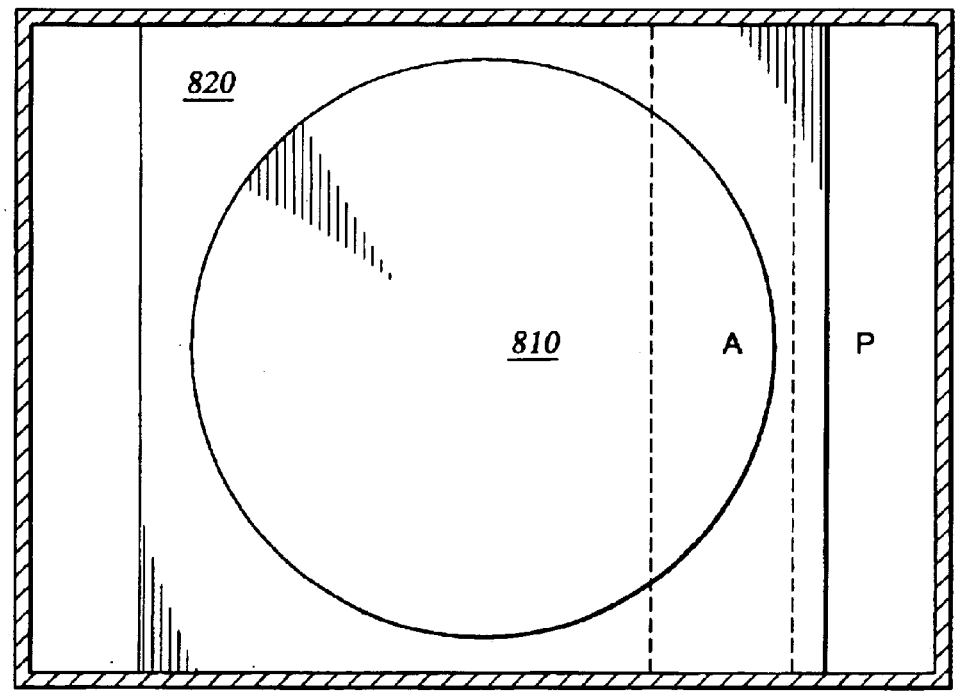
FIG. 15 shows a simplified diagram of one substrate disposed within a reaction chamber at time $T_2$ when compound A reaches a proximate section on the surface of the substrates.

FIG. 15 shows a simplified diagram P of one substrate disposed within the cassette-like reaction chamber at time $T_2$ when compound A reaches a proximate section of the substrate surface. As shown, A contacts at least at a portion of the proximate section allowing the molecules of A to adsorb thereon. Referring to FIGS. 11 and 12, no reaction takes place anywhere on the substrate surface at this point, but B is simultaneously contained within the reaction zone and is separated from A by P. The pressure exerted on A by the gas stream in combination with the lower pressure of the chamber causes A to radially propagate toward a distal edge of the substrate.

Figure 16:
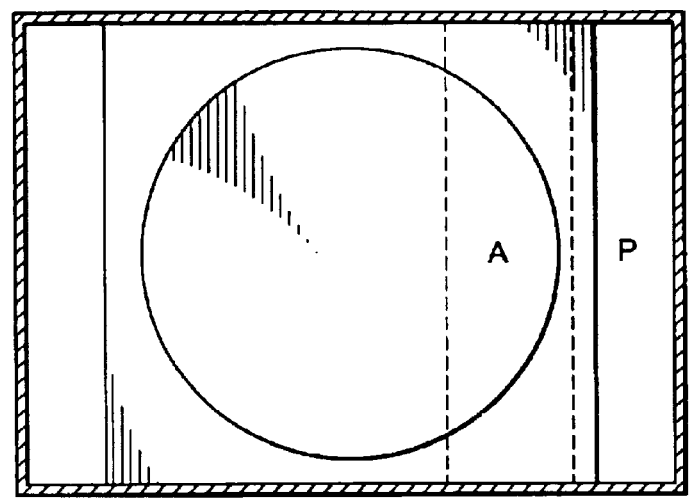
FIG. 16 shows a simplified diagram of one substrate disposed within a reaction chamber at time $T_3$ when compound A reaches a central section of the substrate.

FIG. 16 shows a simplified diagram of one substrate disposed within the cassette-like reaction chamber at time $T_3$ when compound A reaches a central section of the substrate surface. Here, the molecules of compound A adsorb onto at least a portion of the central section. At this point, at least a monolayer of A has been deposited on the proximate section and at least a portion of the central section. P is now in contact with at least a portion of the proximate section and carries away any non-adsorbed A therefrom. Again, no reaction takes place, but B is simultaneously contained within the reaction zone and is separated from A by P. In the distal end section, no adsorption or reaction takes place. The differential pressure continues to move A toward an edge of the substrate.

Figure 17:
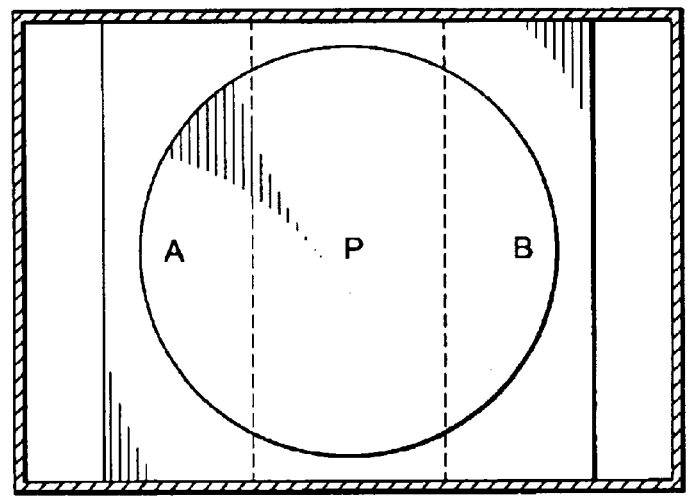
FIG. 17 shows a simplified diagram of one substrate disposed within a reaction chamber at time $T_4$ when compound A reaches the distal end section of the substrate.

FIG. 17 shows a simplified diagram of one substrate disposed within the cassette-like reaction chamber at time $T_4$ when compound A reaches the distal end section of the substrate. Due to the exposure of A at the distal end section, the molecules of A adsorb onto at least a portion of the distal end as the wave of A continues to flow across the surface of the substrate. Additionally, the dose of B is now in contact with at least a portion of the proximate section of the substrate that A had previously adsorbed onto. Accordingly, B adsorbs onto the molecular layer of A and reacts to form a film of AB as B continues to move toward the central section. No adsorption or reaction takes place in the central section that is covered by P although there may be some adsorption of A until P removes A therefrom. The differential pressure continues to move the waves across the substrate surface and into the vacuum system.

Figure 18:
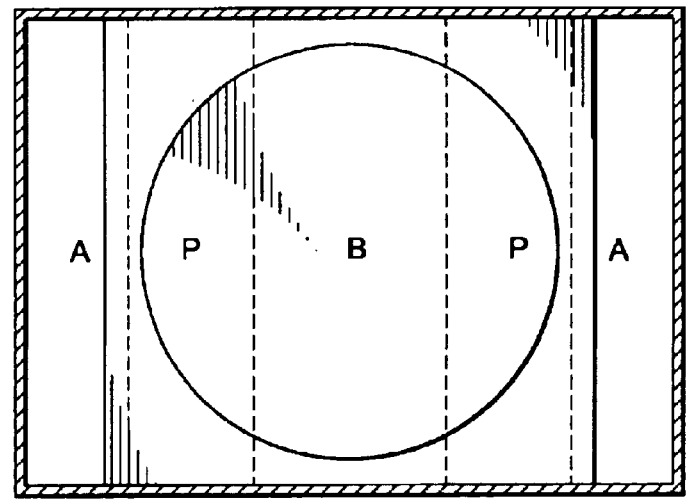
FIG. 18 shows a simplified diagram of one substrate disposed within a reaction chamber at time $T_5$ when compound A reaches an outer edge of the substrate and compound B moves toward a portion of the proximate section of the substrate.

FIG. 18 shows a simplified diagram of one substrate disposed within the cassette-like reaction chamber at time $T_5$ when B enters the central section. Here, the molecules of B adsorb onto at least a portion of the central section that A had previously adsorbed onto. Accordingly, B adsorbs onto the layer of A and reacts to form a film of AB. The distal end and proximate sections are covered by P so no adsorption or reaction takes place, although in the proximate section, B may still be adsorbing onto a layer of A and reacting to form a film of AB until P carries away any non-adsorbed B. Likewise, in the distal end section, A may still be adsorbing onto the surface until P removes any non-adsorbed A. The differential pressure continues to move the waves across the substrate surface and into the vacuum system.

Figure 19:
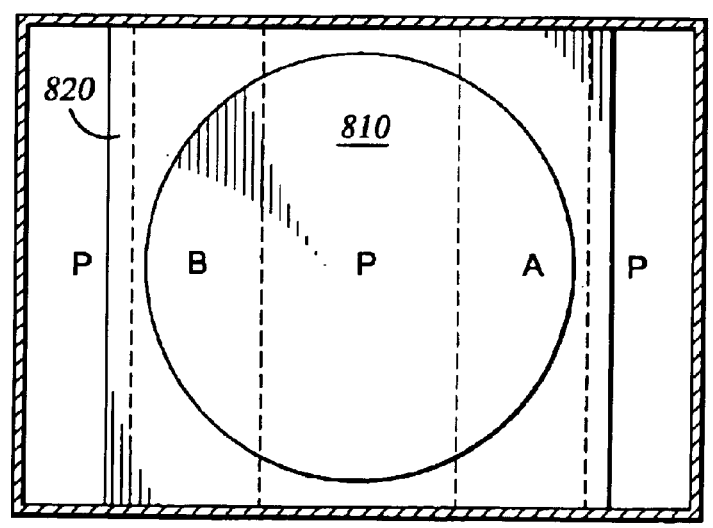
FIG. 19 shows a simplified diagram of one substrate disposed within a reaction chamber at time $T_6$ when compound B reaches the outer edge of the substrate and compound A contacts at least a portion of the central section of the substrate.

FIG. 19 shows a simplified diagram of the cassette-like reaction chamber at time $T_6$ when a subsequent pulse of A moves toward at least a portion of the proximate section of the substrate surface. In the proximate section, the subsequent pulse of A adsorbs onto at least a portion of the AB layer formed by the previous cycle. The central section is covered by P so no adsorption or reaction takes place although there may be some adsorption of B until P removes B thereform. In the distal end section, B adsorbs onto the molecular layer of A and reacts to form a film of AB. The differential pressure continues to move the waves across the substrate surface and into the vacuum system.

While the foregoing is directed to embodiments of the present invention, other and further embodiments of the invention may be devised without departing from the basic scope thereof, and the scope thereof is determined by the claims that follow.

What is claimed is:

1. A method for simultaneous deposition of multiple compounds on a substrate, comprising:
    flowing a gas stream into a processing chamber and across a substrate surface disposed therein, the gas stream comprising:
        at least one dose of a first compound; and
        at least one dose of a second compound,
    wherein the doses of the first and second compounds are separated by a time delay, and wherein the at least one dose of the first compound and the at least one dose of the second compound are simultaneously in fluid communication with the substrate surface; and
    depositing the compounds on the substrate surface.

2. The method of claim 1, wherein the gas stream comprises a plurality of doses of a first compound arid a plurality of doses of a second compound.

3. The method of claim 1, wherein at least one dose of the first compound and at least one dose of the second compound are simultaneously contained within a volume of the chamber adjacent the substrate surface.

4. The method of claim 3, wherein the gas stream propagates radially over the substrate surface.

5. The method of claim 1, wherein the first compound adsorbs onto at least a first portion of the substrate surface while the second compound simultaneously adsorbs onto a second portion of the substrate surface.

6. The method of claim 1, wherein the first compound contacts a periphery of the substrate surface at the same time as the second compound contacts a central portion of the substrate surface.

7. The method of claim 4, wherein the first compound contacts a periphery of the substrate surface simultaneous to the second compound passing a diaphragm of a dosing valve providing the second compound to the substrate surface.

8. The method of claim 1, wherein the gas stream further comprises at least one pulse of a non-reactive gas between each pulse of the first and second compounds.

9. The method of claim 8, wherein the gas stream forms a repeatable chain of doses of the first compound, the non-reactive gas, the second compound, and the non-reactive gas.

10. The method of claim 1, wherein the gas stream further comprises a continuous flow of a non-reactive gas.

11. The method of claim 1, wherein the first compound comprises one or more compounds selected from a group consisting of titanium tetrachloride ($TiCl_4$), tungsten hexafluoride ($WF_8$), tantalum pentachloride (TaCl5), titanium iodide ($TiI_4$), titanium bromide ($TiBr_4$)tetrakis (dimethylamido) titanium (TDMAT), pentakis (dimethyl amido) tantalum (PDMAT), tetrakis (diethylamido) titanium (TDEAT), tungsten hexacarbonyl ($W(CO)_5$), tungsten hexachloride ($WCl_6$), tetrakis(diethylamido) titanium (TDEAT), pentakis (ethyl methyl amido) tantalum (PEMAT), and pentakis(diethylamido)tantalum (PDEAT).

12. The method of claim 1, wherein the second compound comprises one or more compounds selected from a group consisting of ammonia ($NH_3$), hydrazine ($N_2H_4$), monomethyl hydrazine ($CH_3N_2H_3$), dimethyl hydrazine ($C_2H_6N_2H_2$), t-butylhydrazine ($C_4H_9N_2H_3$), phenylhydrazine ($C_6H_5N_2H_3$), 2,2'-azoisobutane (($CH_3)_6C_2N_2$), ethylazide ($C_2H_5N_3$), and nitrogen ($N_2$).

13. The method of claim 8, wherein the non-reactive gas comprises hydrogen, nitrogen, argon, helium, and mixtures thereof.

14. The method of claim 1, wherein the first compound comprises tungsten hexafluoride ($WF_6$) and the second compound comprises ammonia.

15. The method of claim 1, wherein the gas stream further comprises a third compound comprising one or more compounds selected from a group consisting of titanium tetrachloride ($TiCl_4$), tungsten hexafluoride ($WF_6$), tantalum pentachloride ($TaCl_5$), titanium iodide ($TiI_4$), titanium bromide ($TiBr_4$), tetrakis(dimethylamido)titanium (TDMAT), pentakis(dimethyl amido) tantalum (PDMAT), tetrakis (diethylamido)titanium (TDEAT), tungsten hexacarbonyl ($W(CO)_6$), tungsten hexachloride ($WCl_8$), tetrakis (diethylamido) titanium (TDEAT), pentakis (ethyl methyl amido) tantalum (PEMAT), pentakis(diethylamido)tantalum (PDEAT), ammonia ($NH_3$), hydrazine ($N_2H_4$), monomethyl hydrazine ($CH_3N_2H_3$), dimethyl hydrazine ($C_2H_6N_2H_2$), t-butylhydrazine ($C_4H_9N_2H_3$), phenylhydrazine ($C_6H_5N_2H_3$), 2,2'-azoisobutane (($CH_3)_6C_2N_2$), ethylazide ($C_2H_5N_3$), and nitrogen ($N_2$).

16. A method for simultaneous deposition of multiple compounds on a substrate, comprising:
    flowing a gas stream into a processing chamber and across a surface substrate disposed therein, the gas stream comprising:

at least one dose of a first compound; and at least one dose of a second compound, wherein the doses of the first and second compounds are separated by a time delay, and wherein the first compound adsorbs onto at least a first portion of the substrate surface while the second compound simultaneously adsorbs onto a second portion of the substrate surface.

17. The method of claim 16, wherein the first compound contacts a periphery of the substrate surface at the same time as the second compound contacts a central portion of the substrate surface.

18. The method of claim 16, wherein at least one dose of the first compound and at least one dose of the second compound are simultaneously contained within a volume of the chamber adjacent the substrate surface.

19. The method of claim 16, wherein the first compound contacts a periphery of the substrate surface simultaneous to the second compound passing a diaphragm of a dosing valve providing the second compound to the substrate surface.

20. The method of claim 16, wherein the gas stream further comprises at least one pulse of a non-reactive gas between each pulse of the first and second compounds.

21. The method of claim 20, wherein the gas stream forms a repeatable chain of doses of the first compound, the non-reactive gas, the second compound, and the non-reactive gas.

22. The method of claim 16, wherein the gas stream further comprises a continuous flow of a non-reactive gas.

23. A method for simultaneous deposition of multiple compounds on a substrate, comprising:

flowing a gas stream into a processing chamber and across a surface of a substrate disposed therein, the gas stream comprising:
at least one dose of a first compound; and
at least one dose of a second compound, whereby the doses of the first and second compounds are separated by a time delay;
wherein the first compound and the second compound form a repeatable chain of compounds simultaneously contained within a reaction zone of the processing chamber, the reaction zone comprising a volume between each dosing valve providing the compounds and the substrate that is in fluid communication with the substrate surface; and depositing the compounds on the substrate surface.

24. The method of claim 23, wherein the reaction zone includes a volume adjacent a diaphragm of each dosing valve.

25. The method of claim 24, wherein the first compound contacts a periphery of the substrate surface simultaneous to the second compound passing the diaphragm of the dosing valve providing the second compound to the substrate surface.

26. The method of claim 23, wherein the gas stream further comprises at least one pulse of a non-reactive gas between each pulse of the first and second compounds.

27. The method of claim 26, wherein the gas stream forms a repeatable chain of doses of the first compound, the non-reactive gas, the second compound, and the non-reactive gas.

28. The method of claim 23, wherein the gas stream further comprises a continuous flow of a non-reactive gas.

29. A method for simultaneous deposition of multiple compounds on a substrate, comprising:

flowing a gas stream into a processing chamber and across an exposed face of a substrate supported therein for processing, the gas stream comprising:
at least one dose of a first compound or precursor thereof; and
at least one dose of a second compound or precursor thereof, said doses of first and second compounds being separated by a time delay;
wherein the respective durations of said first and second compound doses and said time delay being are such that said first compound and said second compound are adsorbed simultaneously at respective different locations on the face of the substrate.

30. The method of claim 29, wherein at least one dose of said first compound and at least one dose of the second compound are simultaneously contained within a volume of the chamber adjacent the substrate face.

31. The method of claim 29, wherein the gas stream further includes a nonreactive gas.

32. The method of claim 31, wherein the nonreactive gas component is continuously flowed.

33. The method of claim 31, wherein the gas steam includes at least one dose of a nonreactive gas between respective doses of said first and second compounds.

34. The method of claim 29, wherein said gas stream propagates radially over the exposed face of the substrate.

35. The method of claim 34, wherein the gas stream propagates over the exposed face of the substrate in a direction parallel to one of the diameters of the substrate.

36. The method of claim 1, wherein the doses of the first compound and the second compound at least partially overlap to co-react the compounds.

37. The method of claim 16, wherein the doses of the first compound and the second compound at least partially overlap to co-react the compounds.

38. The method of claim 23, wherein the doses of the first compound and the second compound at least partially overlap to co-react the compounds.

39. The method of claim 29, wherein the doses of the first compound and the second compound at least partially overlap to co-react the compounds.

* * * * *

UNITED STATES PATENT AND TRADEMARK OFFICE
CERTIFICATE OF CORRECTION

PATENT NO.        : 6,875,271 B2                                     Page 1 of 1
APPLICATION NO. : 10/118863
DATED             : April 5, 2005
INVENTOR(S)       : W. Benjamin Glenn and Donald J. Verplancken It is certified that error appears in the above-identified patent and that said Letters Patent is hereby corrected as shown below:

<u>In the Claims</u>

Column 13, Claim 2, Line 62: Change "arid" to --and--

Column 14, Claim 11, Line 26: Change "($WF_8$)" to --($WF_6$)--

Column 14, Claim 11, Line 26: Change "(TaCl5)" to --($TaCl_5$)--

Column 14, Claim 11, Line 27: Insert a comma and a space after "($TiBr_4$)"

Column 14, Claim 11, Line 30: Change "($W(CO)_5$)" to --($W(CO)_6$)--

Column 14, Claim 15, Line 55: Change "($WCl_8$)" to --($WCl_6$)--

Column 16, Claim 29, Line 22: After "delay", delete "being"

Signed and Sealed this

Twenty-fourth Day of October, 2006

JON W. DUDAS
*Director of the United States Patent and Trademark Office*